United States Patent
Kamio et al.

(10) Patent No.: US 10,522,325 B2
(45) Date of Patent: Dec. 31, 2019

(54) CHARGED PARTICLE BEAM DEVICE AND IMAGE PROCESSING METHOD IN CHARGED PARTICLE BEAM DEVICE

(71) Applicant: HITACHI HIGH-TECHNOLOGIES CORPORATION, Tokyo (JP)

(72) Inventors: Masato Kamio, Tokyo (JP); Masashi Watanabe, Tokyo (JP); Katsunori Hirano, Tokyo (JP); Yoshinobu Hoshino, Tokyo (JP); Shigeru Kawamata, Tokyo (JP); Yuichi Sakurai, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/776,404

(22) PCT Filed: Nov. 27, 2015

(86) PCT No.: PCT/JP2015/083488
§ 371 (c)(1),
(2) Date: May 15, 2018

(87) PCT Pub. No.: WO2017/090204
PCT Pub. Date: Jun. 1, 2017

(65) Prior Publication Data
US 2018/0301316 A1 Oct. 18, 2018

(51) Int. Cl.
*H01J 37/28* (2006.01)
*G06T 5/00* (2006.01)
(Continued)

(52) U.S. Cl.
CPC ............ *H01J 37/28* (2013.01); *G06T 5/007* (2013.01); *H01J 37/222* (2013.01);
(Continued)

(58) Field of Classification Search
CPC .......... H01J 37/22; H01J 37/244; H01J 37/28; H01J 2237/221; H01J 2237/2806; G06T 5/007
See application file for complete search history.

(56) References Cited

U.S. PATENT DOCUMENTS

| | | | | |
|---|---|---|---|---|
| 5,523,567 A | * | 6/1996 | Kawamata | H01J 37/28 250/310 |
| 5,929,439 A | | 7/1999 | Todokoro et al. | |

(Continued)

FOREIGN PATENT DOCUMENTS

| | | |
|---|---|---|
| JP | S56076153 A | 6/1981 |
| JP | H07-130319 A | 5/1995 |

(Continued)

OTHER PUBLICATIONS

International Search Report dated Feb. 16, 2016 and International Preliminary Report on Patentability dated Aug. 8, 2017 of the PCT International Application No. PCTJP2015/083488.

(Continued)

*Primary Examiner* — David E Smith
(74) *Attorney, Agent, or Firm* — Volpe and Koenig, P.C.

(57) ABSTRACT

There is provided a charged particle beam device which includes a charged particle beam source, a charged particle beam optical system that irradiates a sample with a charged particle beam from the charged particle beam source, a detector that detects a secondary signal generated from the sample by irradiation with the charged particle beam, and an image processing unit that executes integration processing of image data obtained from the secondary signal and outputting an integrated image, and in which the image processing unit executes a normalization integration com- (Continued)

putation of outputting an integrated image in which a luminance value of the integrated image is always "1" in an integration process.

17 Claims, 29 Drawing Sheets

(51) Int. Cl.
    *H01J 37/22*     (2006.01)
    *H01J 37/26*     (2006.01)
(52) U.S. Cl.
    CPC ....... *H01J 37/265* (2013.01); *H01J 2237/221* (2013.01); *H01J 2237/2806* (2013.01)

(56) References Cited

U.S. PATENT DOCUMENTS

| | | | | |
|---|---|---|---|---|
| 8,000,939 | B2* | 8/2011 | Kobaru | H01J 37/222 250/310 |
| 2008/0069453 | A1 | 3/2008 | Abe et al. | |
| 2008/0215260 | A1 | 9/2008 | Kobaru | |
| 2012/0098954 | A1 | 4/2012 | Yamaguchi et al. | |
| 2013/0126733 | A1* | 5/2013 | Fukuda | H01J 37/222 250/310 |
| 2014/0219546 | A1 | 8/2014 | Minekawa et al. | |

FOREIGN PATENT DOCUMENTS

| | | | |
|---|---|---|---|
| JP | H09-330679 | A | 12/1997 |
| JP | 2000-182556 | A | 6/2000 |
| JP | 2000182556 | A * | 6/2000 |
| JP | 2008-065458 | A | 3/2008 |
| JP | 2008-186727 | A | 8/2008 |
| JP | 2010-182573 | A | 8/2010 |
| JP | 2010-198827 | A | 9/2010 |
| JP | 2012-049049 | A | 3/2012 |
| JP | 2013-069951 | A | 4/2013 |
| WO | 2011/001635 | A1 | 1/2011 |
| WO | 2012/039206 | A1 | 3/2012 |

OTHER PUBLICATIONS

Chinese Office Action dated May 5, 2019 for the Chinese Patent Application No. 201580084616.4.
Chinese Office Action dated Jul. 12, 2019 for the Chinese Patent Application No. 201580084616.4.

* cited by examiner $$S_i(x,y) = \frac{I_i(x,y)}{N} + S_{i-1}(x,y) \quad i=1,2\cdots N \quad \cdots(1-a)$$

$$S_0 = 0$$

$$S_N(x,y) = \sum_{i=1}^{N} \frac{I_i(x,y)}{N} = \frac{1}{N}\sum_{i=1}^{N} I_i(x,y)$$

$$= \frac{I_1(x,y) + I_2(x,y) + I_3(x,y)\cdots I_N(x,y)}{N} \quad \cdots(1-b)$$

$$S_i(x,y) = \frac{1}{i} \times I_i(x,y) + \left(1-\frac{1}{i}\right) \times S_{i-1}(x,y) \quad i=1,2\cdots N \quad \cdots(6-b)$$

$$S_0 = 0$$

$$S_N = \frac{I_1(x,y)+I_2(x,y)+I_3(x,y)\cdots I_N(x,y)}{N} \quad \cdots(6-f)$$

$$K_2 + K_3 = 1 \quad (K_3 = 1-K_2) \quad \cdots(6-c)$$

$$K_2 = \left(\frac{1}{i}\right) \quad \cdots(6-d)$$

$$K_3 = \left(1-\left(\frac{1}{i}\right)\right) \quad \cdots(6-e)$$

SCANNING DIRECTION

SCANNING DIRECTION $$SNR = \left(\frac{S}{N}\right) = \left(\frac{R(x,y)}{S_i(x,y)}\right)$$

$R(x,y)$ ... REFERENCE IMAGE WITHOUT NOISE
$S_i(x,y)$ ... INTEGRATED IMAGE (i-th INTEGRATED IMAGE)

$$S_i(x,y) = \frac{1}{i} \times I_i(x,y) + \left(1 - \frac{1}{i}\right) \times S_{i-1}(x,y) \quad i = 1, 2 \cdots N$$

$$\delta_i(x,y) = S_i(x,y) - S_{i-1}(x,y)$$

$S_i(x,y)\cdots$ INTEGRATED IMAGE DATA (PIXEL DATA) OF i-th FRAME $S_{i-1}(x,y)\cdots$ INTEGRATED IMAGE DATA (PIXEL DATA) OF (i-1)-th FRAME $\delta_i \cdots$ LUMINANCE VALUE DIFFERENCE BETWEEN $S_i(x,y)$ AND $S_{i-1}(x,y)$ $$CNR = \frac{C_{image}}{\sigma_n}$$

$$SNR = \frac{S}{\sigma_n}$$

CHARGED PARTICLE BEAM DEVICE AND IMAGE PROCESSING METHOD IN CHARGED PARTICLE BEAM DEVICE

TECHNICAL FIELD

The present invention relates to a charged particle beam device and an image processing method in the charged particle beam device.

BACKGROUND ART

A microscope or the like using a charged particle beam scans a sample with the charged particle beam which the sample is irradiated in two dimensions of the horizontal direction and the vertical direction and detects a secondary signal generated from an irradiation region. The microscope amplifies and integrates the detected signal by an electric circuit and correlates the detected signal with scanning coordinates of the charged particle beam, thereby generating a two-dimensional image.

Here, regarding a device that performs image formation, an image forming method for improving a signal-to-noise ratio (S/N ratio) by integrating a plurality of pieces of two-dimensional image data is known. In PTL 1, PTL 2, PTL 3, PTL 4, and PTL 5, in order to suppress the influence of noise as described above, a technique in which the same imaging region is scanned a plurality of times and adds and averages signals obtained by the scanning is described. By performing adding and averaging, it becomes possible to suppress irregularly occurring noise to some extent.

In PTL 1, a method of controlling a gain of a multiplier for integration computation as an input pixel luminance value largely fluctuates due to the influence of noise is described. In PTL 2, a method in which a plurality of frame memories necessary for frame integration are mounted, a frame image before two frames is also set as a target of integration computation, and a multiplication rate thereof is switched is described. In PTL 3, a frame integration method in which an averaging arithmetic expression of frame integration computation multiplied by an exponent and divided by the exponent is used as an arithmetic expression is described. In PTL 4, a method of appropriately adjusting signal intensity of an image to be integrated is described. In PTL 5, a method of detecting positional deviation and variably setting a frame integration number with respect to the degree of positional deviation is described.

CITATION LIST

Patent Literature

PTL 1: JP-A-2010-182573
PTL 2: JP-A-2000-182556
PTL 3: JP-A-2008-186727
PTL 4: JP-A-9-330679
PTL 5: JP-A-2012-049049
PTL 6: JP-A-7-130319

SUMMARY OF INVENTION

Technical Problem

In the conventional frame integration method, a frame-integrated image is generated by dividing an input image by a frame integration number which is set in advance and addition is made thereto by the integration number. Accordingly, the conventional frame-integrated image is initially in a dark state in an integration process and then gradually becomes a bright state and thus, the user cannot confirm the image in the integration process.

Accordingly, the present invention provides a technique for displaying a frame-integrated image with no sense of discomfort (no dark display) in the integration process.

Solution to Problem

For example, in order to solve the problem described above, a configuration described in the claims is adopted. Although the present application includes plurality of means for solving the problem described above, as an example thereof, there is provided a charged particle beam device which includes a charged particle beam source, a charged particle beam optical system that irradiates a sample with a charged particle beam from the charged particle beam source, a detector that detects a secondary signal generated from the sample by irradiation with the charged particle beam, and an image processing unit that executes integration processing of image data obtained from the secondary signal and outputting an integrated image, and in which the image processing unit executes a normalization integration computation of outputting an integrated image in which a luminance value of the integrated image is always "1" in integration process.

Also, according to another example, there is provided a charged particle beam device which includes a charged particle beam source, a charged particle beam optical system for irradiating each of a plurality of divided regions in a sample with a charged particle beam from the charged particle beam source, a detector for detecting a secondary signal generated from each of the plurality of divided regions by irradiation with the charged particle beam, an image processing unit for executing integration processing of image data obtained from the secondary signal and outputting an integrated image, and a display unit for displaying the integrated image for each of the plurality of divided regions, and in which the image processing unit determines the end of the integration processing according to image quality of the integrated image for each of the plurality of divided regions.

According to still another example, there is provided an image processing method in a charged particle beam device, which includes a step of irradiating a sample with a charged particle beam from the charged particle beam source, by a charged particle beam optical system, a step of detecting a secondary signal generated from the sample by irradiation with the charged particle beam, by a detector, a step of executing integration processing of image data obtained from the secondary signal and outputting an integrated image, by an image processing unit, and in which the outputting step includes executing normalization integration computation of outputting an integrated image in which a luminance value of the integrated image is always "1" in integration process.

Advantageous Effects of Invention

According to the present invention, it is possible to display a frame-integrated image with no sense of discomfort (no dark display) in the integration process. Further features relating to the present invention will become apparent from description of the present specification and accompanying drawings. Also, the problems, configurations, and effects other than those described above will be clarified by description of the following embodiments.

DESCRIPTION OF EMBODIMENTS

Hereinafter, embodiments of the present invention will be described with reference to the accompanying drawings. The accompanying drawings illustrate specific examples according to the principle of the present invention, but these are for understanding of the present invention and are not used to limitedly interpret the present invention in any way.

The embodiments described below relate to an image forming apparatus for forming an image by integrating image data obtained by a charged particle beam device for scanning a charged particle beam at a high speed, and more particularly to a function of forming an image by integrating image data in units of frames.

[Comparative Example]

Figure 1:
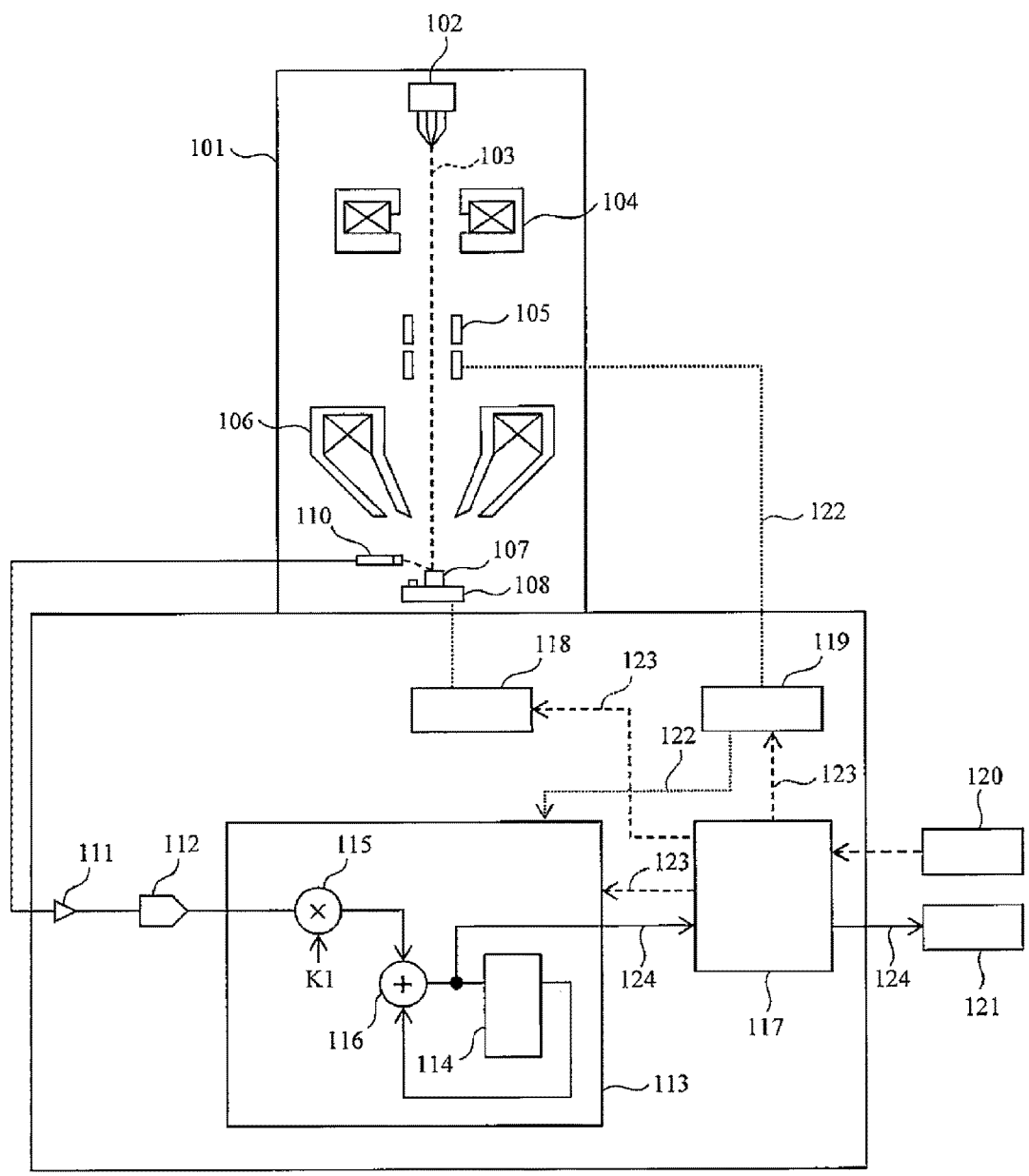
FIG. 1 is a diagram illustrating a configuration of a charged particle beam device relating to conventional frame-integrated image acquisition.

FIG. 1 is a diagram for explaining an outline of a scanning electron microscope, which is an example of a snorkel lens type scanning electron microscope (SEM).

The scanning electron microscope includes an electron optical system constituted with optical elements such as an electron gun 102, a focusing lens 104, a deflection coil 105, and an objective lens 106.

A sample 107 is disposed on a sample stage 108 in a vacuum column 101. A predetermined position of the sample 107 is irradiated with an electron beam 103 generated by the electron gun 102. The electron beam 103 is focused by the focusing lens 104 and further narrowed by the objective lens 106. The electron beam 103 is controlled to be deflected by the deflection coil 105. Secondary electrons, reflected electrons, and other secondary signals are generated from a surface of the sample 107 irradiated with the electron beam 103. These secondary signals are detected by a detector 110.

An information processing unit 117 is a control unit that comprehensively controls the scanning electron microscope. The information processing unit 117 controls a lens control unit (not illustrated), a stage control unit 118, a deflection control unit 119, and an image processing unit 113 by a control signal 123.

For example, the information processing unit 117 includes a processor (also, referred to as a computation unit) and a storing unit (for example, a memory or the like). The information processing unit 117 may be realized by executing a program of desired computation processing by a processor.

The information processing unit 117 is connected to an information input device 120. That is, the information processing unit 117 has an interface with an external device. The information input device 120 is, for example, a keyboard, a mouse, or the like. The information processing unit 117 is connected to an information transmission apparatus 121. The information processing unit 117 displays a state of each portion which is a management target and the detected image on a display device (for example, a monitor or the like) of the information transmission apparatus 121.

The sample stage 108 is controlled by a stage control unit 118. Deflection of the electron beam 103 is controlled by a deflection control unit 119. The deflection control unit 119 controls a deflection current to be supplied to the deflection coil 105 to change magnetic field strength and causes the electron beam 103 to scan in the horizontal direction and the vertical direction. The deflection control unit 119 also supplies a signal (deflection signal 122) for controlling the degree of deflection to an image processing unit 113. Lens intensities of the focusing lens 104 and the objective lens 106 are adjusted by a lens control unit (not illustrated). The image processing unit 113 detects the secondary signal generated in synchronization with scanning by the deflection signal through the detector 110.

The signal detected by the detector 110 is amplified by an amplifier 111 and converted into a digital signal by an analog-to-digital converter (ADC) 112. Image data converted to digital is input to a multiplier 115 in the image processing unit 113. The multiplier 115 multiplies image data converted to digital described above by a coefficient K1. The coefficient K1 is set by the image processing unit 113. The multiplied image data is input to an adder 116. The adder 116 adds the input image data and image data read from a frame memory 114, and outputs the added image data 124 to the frame memory 114 and the information processing unit 117.

The image processing unit 113 stores the image data 124 in the frame memory 114. In this case, the image processing unit 113 receives the deflection signal from the deflection control unit 119 as described above, and generates an address (pixel unit) of the two-dimensional coordinate for storing image data in the frame memory based on the deflection signal. According to this address, the image processing unit 113 stores the image data 124 output from the adder 116 in the frame memory 114. Similarly, the image processing unit 113 reads image data stored in the frame memory 114 according to the address of the two-dimensional coordinate and inputs the image data to the adder 116. The information processing unit 117 outputs the image data 124 to the display unit of the information transmission apparatus 121.

Next, a conventional integration processing will be described based on the configuration described above. Since the multiplier 115, the adder 116, and the frame memory 114 are configured as described above, the image data detected by the detector 110 according to deflection control and image data one scan before (one frame before) stored in the frame memory 114 are input to the adder 116. The image data detected by the detector 110 is multiplied by the coefficient K1 by the multiplier 115. Here, the coefficient K1 is a reciprocal of an integration number N.

Figures 2, 3:
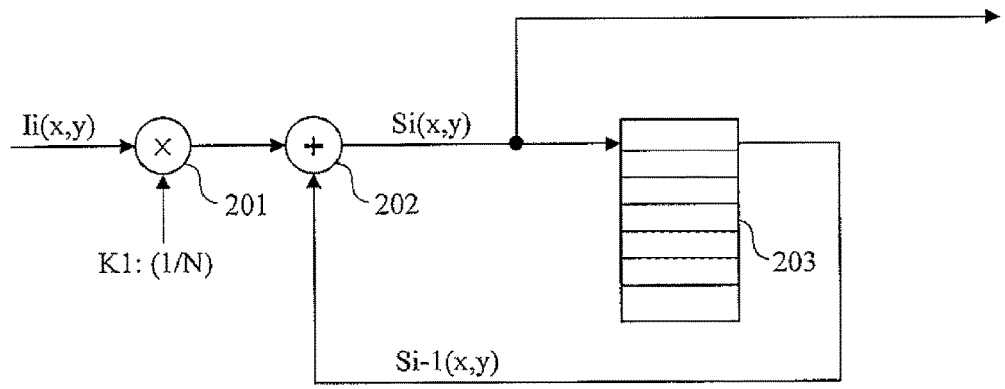
FIG. 2 is an internal configuration diagram of a conventional image processing unit.
FIG. 3 is a diagram for explaining conventional frame integration computation.

FIG. 2 is an internal configuration diagram of the image processing unit 113 and FIG. 3 is an expression expressing integration process. $I_i(x,y)$ represents pixel data corresponding to x, y coordinates. $I_i(x,y)$ is input to a multiplier 201. The multiplier 201 multiplies $I_i(x,y)$ by the coefficient K1 (1/N), and outputs multiplied data to an adder 202. $S_i(x,y)$ represents pixel data corresponding to the x, y coordinates of the i-th frame input to a frame memory 203. $S_{i-1}(x,y)$ represents pixel data corresponding to the x, y coordinates of the (i−1)-th frame output from the frame memory 203. A calculation expression of $S_i(x,y)$ is as expressed in Expression (1-a) of FIG. 3. The adder 202 executes integration processing of the multiplied data ($I_i(x,y)/N$) and the pixel data $S_{i-1}(x,y)$ one frame before, and the pixel of the i-th frame and outputs data $S_i(x,y)$.

The calculation expression of the integrated pixel data $S_N(x,y)$ is as expressed in Expression (1-b) of FIG. 3. $S_N(x,y)$ means that pixel data corresponding to the x, y coordinates of an input frame is added from a first frame to an integration number N-th frame and is divided by the integration number N. The image processing unit 113 multiplies input pixel data by a reciprocal of the integration number N and adds the multiplied pixel data by the number of integration N times, thereby averaging processing of the pixel data.

Due to the computation processing described above, a luminance value of averaged pixel data becomes a luminance value "1" to be obtained originally when addition of an N-th integration is completed. In the present specification, the luminance value "1" defines a luminance value of a pixel obtained when the luminance value of the input pixel is added N times and is divided by N as "1".

As is generally known, detection signals such as reflected electrons and secondary electrons are invariable in time and thus, correlation between frames is extremely large. In contrast, noise generated in a process of signal detection often contributes randomly and there is almost no correlation between frames. Accordingly, it is possible to reduce noise components and improve the S/N ratio of the image can be improved by an averaging processing (frame integration processing) between frames.

Figure 4:
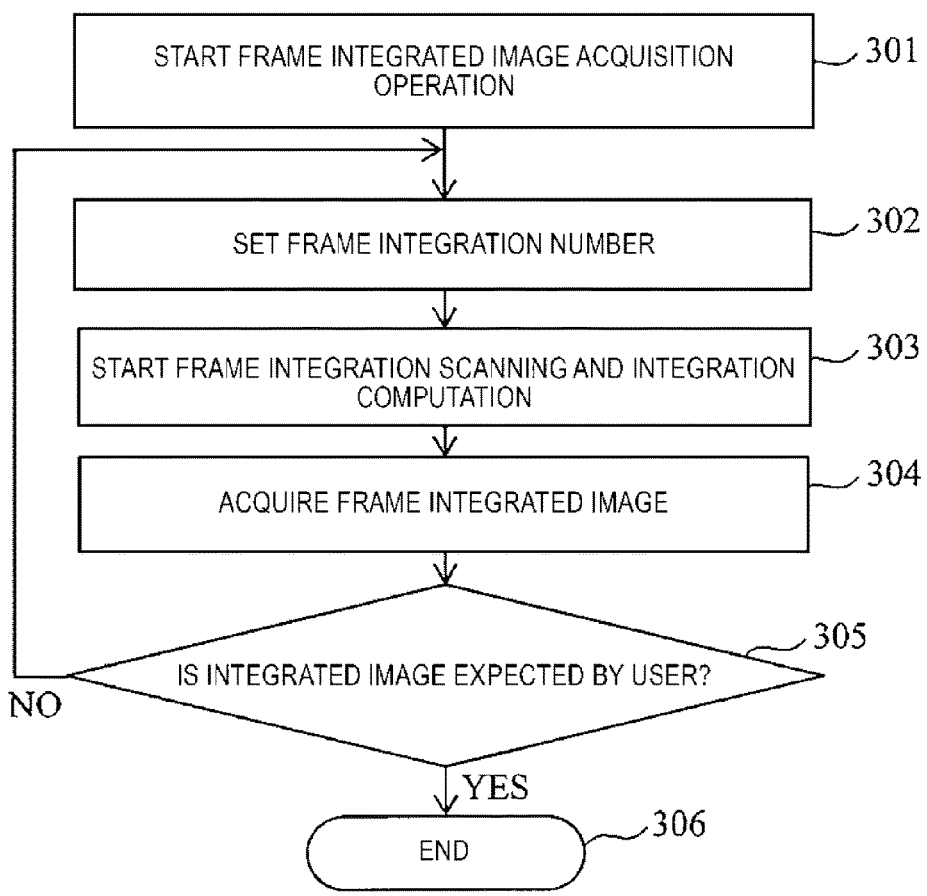
FIG. 4 is a flowchart for explaining a conventional frame-integrated image acquisition procedure.
Figure 5:
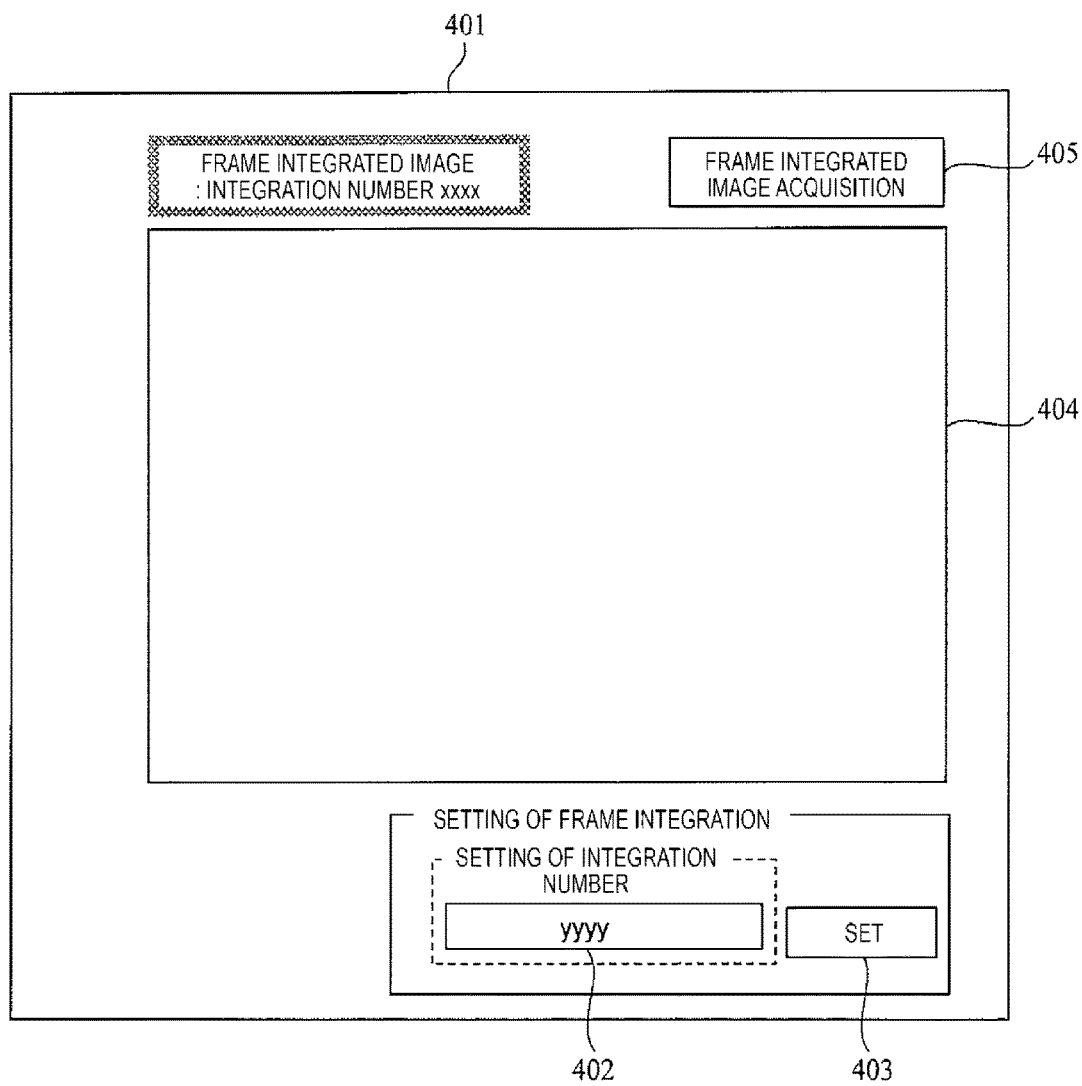
FIG. 5 is a GUI when a conventional frame-integrated image is acquired.

FIG. 4 illustrates an operation flow for obtaining a frame-integrated image using a frame integration circuit having the configuration described above after an observation region for which a frame-integrated image is intended to be acquired is determined by searching a viewing field. FIG. 5 illustrates a graphical user interface (GUI) for acquiring frame-integrated images.

A screen 401 is displayed on the display device of the information transmission apparatus 121. The user starts acquiring the frame-integrated image (STEP 301). Next, the user inputs a frame integration number for the observation region to a setting unit 402, and presses a setting button 403 (STEP 302). In this case, when the integration number is small, an image with poor S/N ratio may be obtained. When the integration number is large, by excessive electron beam irradiation, sample destruction can be caused, contamination can be generated, a sample can be charged up, or an image on which the influence of luminance value saturation and drift is superimposed can be obtained. The user needs to set an optimal integration number for obtaining an image having image quality expected by the user, but it is difficult to ascertain the optimal integration number in advance.

After setting the integration number, the user presses a frame-integrated image acquisition button 405 to execute integrated image acquisition (STEP 303). The scanning electron microscope executes a frame integration scan and an integration computation process. The frame-integrated image is displayed on an image display window 404 (STEP 304). The user confirms whether the image displayed on the image display window 404 is the image having image quality expected by the user (STEP 305). When it is an image having the image quality expected by the user, the frame-integrated image acquisition is ended (STEP 306). However, when it is not the image having the image quality expected by the user, it is necessary to reset the integration number again, execute screen acquisition, and confirm an acquired image (STEP 302 to STEP 305). The user needs to repeat operations of STEP 302 to STEP 305 until the image having the image quality expected by the user can be acquired.

The frame integration number to be set is greatly influenced by composition elements and structures of the sample and observation conditions (accelerating voltage, irradiation yield, degree of vacuum, working distance (WD), and the like). For that reason, it is difficult to ascertain the optimum integration number considering the structure of the sample and observation conditions when the frame-integrated image is acquired. Accordingly, conventionally, cases where the operations of STEP 302 to STEP 305 are repeated to obtain the optimum integration number to acquire the frame-integrated image often occur.

As a result, conventionally, there were the following problems.

(a) It takes time and effort to perform repetitive image acquisition.

(b) Since image acquisition is repeatedly performed, the image acquisition time increases.

(c) The electron beam irradiation time for the sample is increased (electron beam irradiation amount increases) by the (b). There is a high possibility of causing secondary problems such as an increase in the amount of electron beams with which the sample is to be irradiated, causing sample destruction, causing occurrence of contamination, and charging the sample.

In the method described above, for the frame-integrated image, the input pixel data is divided by a frame integration number N which is set in advance and integration processing with pixel data one frame past is executed. This integration processing is repeated until the N-th frame. Here, when it is assumed that definition of the luminance value "1" is as described above, the luminance value of the frame-integrated image of a first frame becomes 1/N and a frame-integrated image up to a second frame is 2/N. Accordingly, the luminance value of the conventional frame-integrated image becomes the "number of input images/integration number N" in the integration process. Therefore, in order for the luminance value to be "1", it is necessary to wait for integration processing up to the N-th frame. As such, since the conventional frame-integrated image is initially in a dark state in the integration process and thereafter gradually becomes a bright state, the user cannot confirm the image in the integration process.

[First Embodiment]

Figure 6:
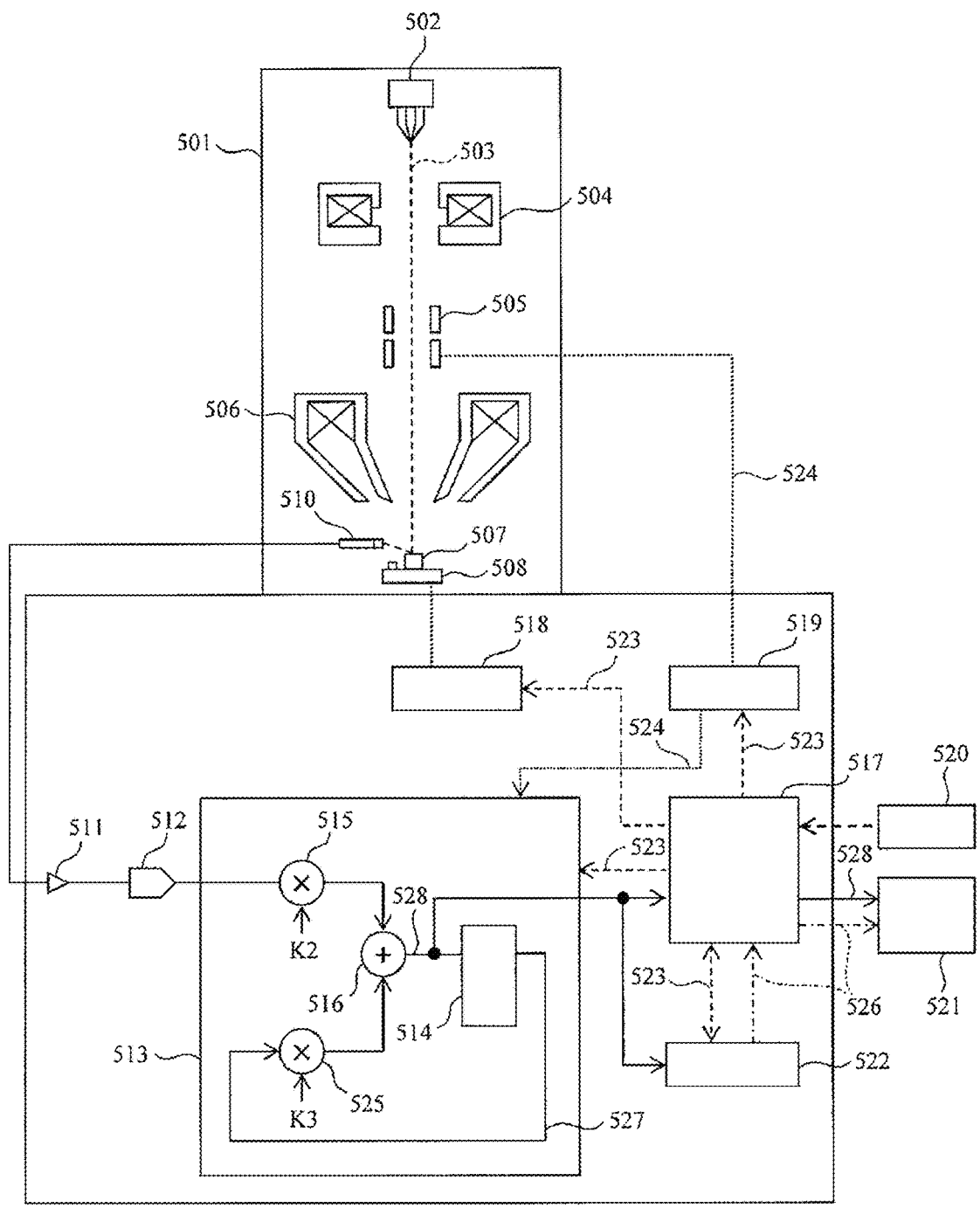
FIG. 6 is a diagram illustrating a configuration of a charged particle beam device relating to frame-integrated image acquisition of the present invention.

In the following, embodiments for solving the above problem will be described. FIG. 6 illustrates an example of a charged particle beam device according to a first embodiment, which is an example of a snorkel lens type scanning electron microscope (SEM).

In the following description, a scanning electron microscope, which is an example of a charged particle beam device, will be described as an example, but is not limited thereto. The present invention can also be applied to other charged particle beam devices such as an ion beam apparatus for synthesizing secondary signals such as images to form a combined signal.

Means for realizing an image processing part in the following embodiment may be subjected to function realization by software or by hardware. In the following example, function realization by hardware will be described.

The scanning electron microscope includes an electron optical system (charged particle beam optical system) constituted with optical elements such as an electron gun (charged particle beam source) 502, a focusing lens 504, a deflection coil 505, and an objective lens 506. The electron beam optical system may include other constituent elements (lens, electrode, and the like) other than the components described above, and is not limited to the configuration described above.

A sample 507 is disposed on a sample stage 508 in a vacuum column 501. A predetermined position of the sample 507 is irradiated with an electron beam 503 generated by the electron gun 502. The electron beam 503 is focused by the focusing lens 504 and further narrowed by the objective lens 506. The electron beam 503 is controlled to be deflected by the deflection coil 505. Secondary electrons, reflected electrons, and other secondary signals are generated from a surface of the sample 507 irradiated with the electron beam 503. These secondary signals are detected by a detector 510.

An information processing unit 517 is a control unit that comprehensively controls the scanning electron microscope. The information processing unit 517 controls a lens control unit (not illustrated), a stage control unit 518, a deflection control unit 519, an image processing unit 513, and an image evaluation unit 522 by a control signal 523.

For example, the information processing unit 517 includes a processor (also, referred to as a computation unit) and a storing unit (for example, a memory or the like). The information processing unit 517 may be realized by executing a program of desired computation processing by a processor.

The information processing unit 517 is connected to an information input device 520. That is, the information processing unit 517 has an interface with an external device. The information input device 520 is, for example, a keyboard, a mouse, or the like. The information processing unit 517 is connected to an information transmission apparatus 521. The information processing unit 517 displays a state of each portion which is a management target and the detected image on a display device (for example, a monitor or the like) of the information transmission apparatus 521.

The image processing unit 513 executes integration processing of the image data obtained from the secondary signal and outputs an integrated image. The image processing unit 513 includes a frame memory 514, a multiplier 515, a multiplier 525, and an adder 516.

The sample stage (stage) 508 is controlled by a stage control unit 518. Deflection of the electron beam 503 is controlled by a deflection control unit 519. The deflection control unit 519 controls a deflection current to be supplied to the deflection coil 505 to change magnetic field strength and causes the electron beam 503 to scan in the horizontal direction and the vertical direction. The deflection control unit 519 also supplies a signal (deflection signal 524) for controlling the degree of deflection to an image processing unit 513. Lens intensities of the focusing lens 504 and the objective lens 506 are adjusted by a lens control unit (not illustrated). The image processing unit 513 detects the secondary signal generated in synchronization with scanning by the deflection signal through the detector 510.

The signal detected by the detector 510 is amplified by an amplifier 511 and converted into a digital signal by an ADC 512. Image data converted to digital is input to a multiplier 515 in the image processing unit 513. The multiplier 515 multiplies image data converted to digital described above by a first coefficient $K_2$ and outputs first image data ($K_2 \times$ image data). The first coefficient $K_2$ is set by the image processing unit 513. The first image data ($K_2 \times$ image data) is input to the adder 516. The image data 527 one frame past is input from a frame memory 514 to a multiplier 525. The multiplier 525 multiplies image data 527 one scan before (one frame before) by a second coefficient $K_3$ and outputs second image data ($K_3 \times$ image data). The second coefficient $K_3$ is set by the image processing unit 513. The second image data ($K_3 \times$ image data) is input to the adder 516. The adder 516 adds the first image data ($K_2 \times$ image data) from the multiplier 515 and the second image data ($K_3 \times$ image data) from the multiplier 525, and adds added image data 528 to the frame memory 514, the information processing unit 517, and the image evaluation unit 522.

The image processing unit 513 stores the image data 528 in the frame memory 514. In this case, the image processing unit 513 receives the deflection signal from the deflection control unit 519 as described above, and generates an address (pixel unit) of the two-dimensional coordinate for storing image data in the frame memory 514 based on the deflection signal. According to this address, the image processing unit 513 stores the image data 528 output from the adder 516 in the frame memory 514. The information processing unit 517 outputs the image data 528 to a display unit of the information transmission apparatus 521. The image evaluation unit 522 evaluates the image data 528 and outputs an evaluated result 526 to the information processing unit 517. The information processing unit 517 controls an integration scan and integration processing of the image processing unit 513 based on the evaluated result 526.

Figures 7, 8:
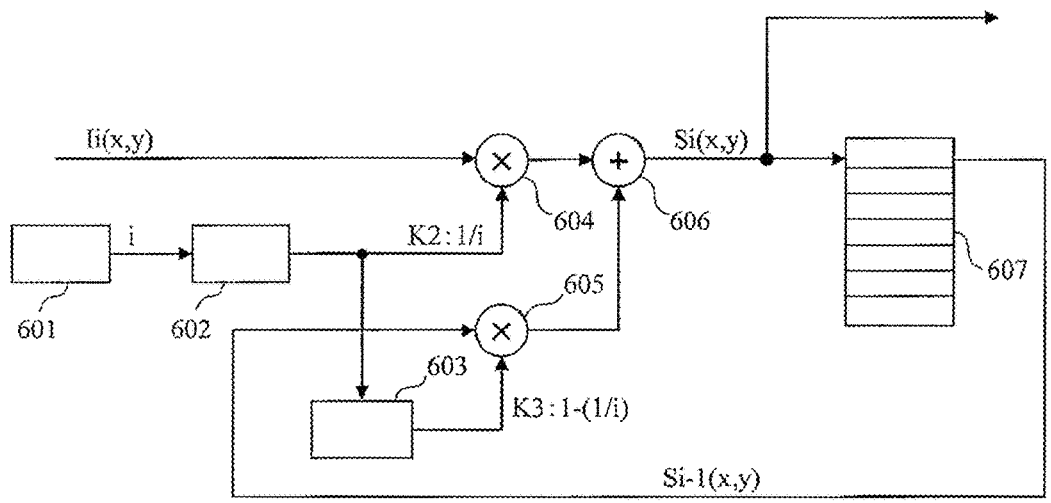
FIG. 7 is an internal configuration diagram of an image processing unit of the present invention.
FIG. 8 is a diagram for explaining frame integration computation of the present invention.

Next, integration processing of the present embodiment will be described based on the configuration described above. FIG. 7 is an internal configuration diagram of the image processing unit 513 and FIG. 8 is an expression representing integration processing. The image processing unit 513 includes an integration counter 601, a first coefficient calculation unit 602, a second coefficient calculation unit 603, a multiplier 604, a multiplier 605, an adder 606, and a frame memory 607.

$I_i(x,y)$ represents pixel data corresponding to the x, y coordinates of an i-th frame input from the detector 510 via the amplifier 511 and the ADC 512. $I_i(x,y)$ is input to the multiplier 604. The integration counter 601 counts and identifies what frame number of image data that is currently detected and inputted based on the deflection signal input from the deflection control unit 519. The integration counter 601 outputs a frame count value i to the first coefficient calculation unit 602. The first coefficient calculation unit 602 outputs the reciprocal of the input frame count value i as a first coefficient $K_2$ (Expression (6-d) in FIG. 8). The first coefficient calculation unit 602 outputs the first coefficient $K_2$ to the multiplier 604 and the second coefficient calculation unit 603. The second coefficient calculation unit 603 calculates a second coefficient $K_3$ based on the value of the first coefficient $K_2$. The second coefficient $K_3$ is calculated as in Equation (6-e) in FIG. 8. Accordingly, the sum of the first coefficient $K_2$ and the second coefficient $K_3$ is 1 ($K_2 K_3 = 1$) (Expression (6-c) in FIG. 8).

The multiplier 604 multiplies $I_i(x,y)$ by the first coefficient $K_2$ and outputs multiplied data to the adder 606. $S_i(x,y)$ represents pixel data corresponding to the x, y coordinates of the i-th frame input to the frame memory 607. Also, $S_{i-1}(x,y)$ represents pixel data corresponding to the x, y coordinates of the (i−1)-th frame from the frame memory 607. The multiplier 605 multiplies $S_{i-1}(x,y)$ by the second coefficient K3 and outputs multiplied data to the adder 606. The calculation expression of $S_i(x,y)$ is as illustrated in Equation (6-b) in FIG. 8. The adder 606 executes integration processing of the multiplied data ($K_2 \times I_i(x,y)$) and the multiplied data ($K_3 \times S_{i-1}(x, y)$) and outputs i-th frame pixel data $S_i(x,y)$.

From the matters as described above, the first coefficient $K_2$ and the second coefficient $K_3$ vary according to the input frame count value i of the integration counter 601. The sum of the first coefficient $K_2$ and the second coefficient $K_3$ is always "1". This means that the luminance value of the integrated image is always "1" in the integration process. That is, in the present embodiment, a normalization process (hereinafter, referred to as a normalization integration computation) is realized in such a way that the luminance value of the integrated image is always "1" in the integration process. From the matters as described above, matters in which the integration computation result is represented in the case where the integration number is N is expressed in Equation (6-f) in FIG. 8 based on the normalization integration computation. This computation result is exactly the same integration result as the conventional frame integration computation result illustrated in Equation (1-b) in FIG. 3, and averaging processing of pixel data similar to the conventional frame integration computation is realized.

From the matters as described above, the frame normalization integration computation of the present embodiment is a method that can always output the integrated image being integrated with its luminance value which is in a state of being "1", in addition to averaging processing of image luminance values which the conventional frame integration computation is realizing.

Figure 9:
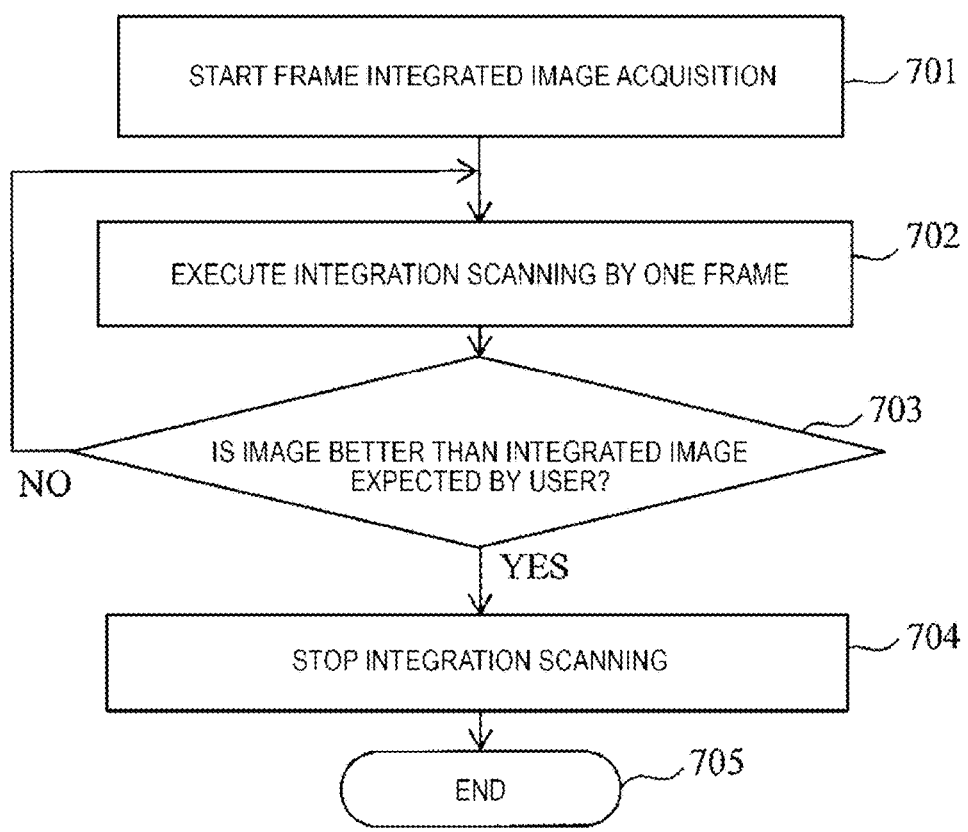
FIG. 9 is a flowchart for explaining a frame-integrated image acquisition processing flow of the present invention.
Figure 10:
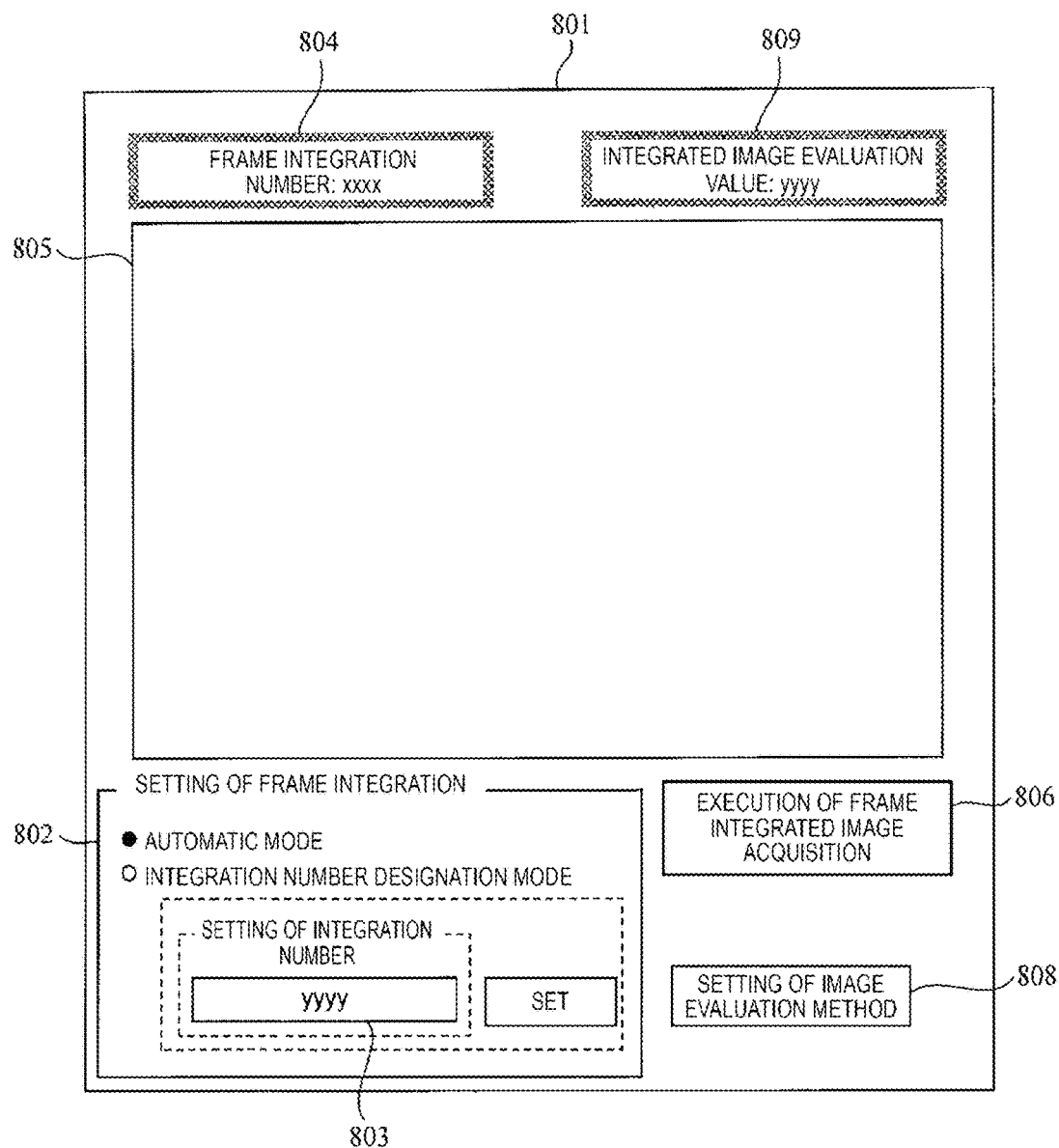
FIG. 10 is a GUI when a frame-integrated image of the present invention is acquired.
Figure 12:
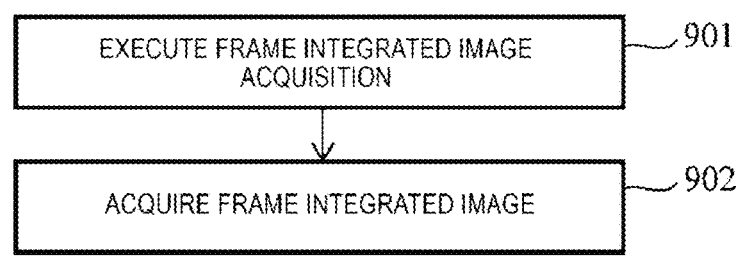
FIG. 12 is a flowchart for explaining an operation procedure of frame-integrated image acquisition of the present invention.

Next, while illustrating an internal processing flow and an operation flow of the user, the means for realizing the image acquisition by the frame normalization integration computation of the present embodiment and the effect thereof will be described in detail. FIG. 9 illustrates a processing flow for obtaining a frame-integrated image using a frame integration circuit having the configuration described above. FIG. 10 illustrates a GUI for acquiring the frame-integrated image. FIG. 12 illustrates the operation flow of the user.

A screen 801 is displayed on a display device of the information transmission apparatus 521. When an observation region for which a frame-integrated image is intended to be acquired is determined, the user executes image acquisition (STEP 701). An execution instruction is input from the information input device 520 to the information processing unit 517, and the integration scan by one frame is executed (STEP 702).

Detected image data is input to the image processing unit 513, and the normalization integration computation described above is applied thereto. In this case, a count value of the integration counter 601 becomes "1", and it is recognized as an integrated image of the first frame. A value corresponding to the first frame is set for the first coefficient $K_2$ and the second coefficient $K_3$, and the integration computation is performed. After the normalization integration computation, the image processing unit 513 outputs frame-integrated image data to the frame memory 514, the information processing unit 517, and the image evaluation unit 522. The frame-integrated image data output to the frame memory 514 is stored in the frame memory 514 as integrated image data of the first frame (integrated image data to which one-time integration is applied). The integrated image data output to the information processing unit 517 is transferred to the information transmission apparatus 521 and displayed as a frame-integrated image in an image display window 805.

The image evaluation unit 522 evaluates the input frame-integrated image data (STEP 703). The image evaluation unit 522 determines whether the frame-integrated image data obtained by the normalization integration process satisfies a certain evaluation condition or not. When the image is better than an image having image quality expected by the user (for example, when the frame-integrated image data satisfies the evaluation condition described later), the image evaluation unit 522 transmits a scan stop instruction to the information processing unit 517 (STEP 704). When the stop instruction is received, the information processing unit 517 stops the integration scan and ends acquisition of the frame-integrated image (STEP 705).

On the other hand, in a case where the image is not better than an image expected by the user, the image evaluation unit 522 transmits an instruction to continue the integration scan to the information processing unit 517, and the information processing unit 517 executes the integration scan for the next frame (Step 702). Image data of the second frame detected by the second the integration scan is input to the image processing unit 513, and the normalization integration computation described above is applied thereto. In this case, the count value of the integration counter 601 becomes "2", which is recognized as an integrated image of the second frame. For the first coefficient $K_2$ and the second coefficient $K_3$, values corresponding to the second frame are set and is subjected to integration computation. After the normalization integration computation, the image processing unit 513 outputs frame-integrated image data to the frame memory 514, the information processing unit 517, and the image evaluation unit 522. The integrated image data output to the frame memory 514 is stored in the frame memory 514 as integrated image data of the second frame (integrated image data to which integration is applied twice). The integrated image output to the information processing unit 517 is transferred to the information transmission apparatus 521 and displayed as a frame-integrated image in the image display window 805.

The image evaluation unit 522 evaluates the input second frame-integrated image (STEP 703). In a case where the integrated image is better than an image having image quality expected by the user (for example, in a case where the frame-integrated image data satisfies an evaluation condition to be described later), the process proceeds to STEP 704, and in a case where the image is not good, the process returns to STEP 702 again. The process of STEP 702 to STEP 703 is repeated until the frame-integrated image becomes better than the image having image quality expected by the user. That is, the image processing unit 513 repeatedly executes the normalization integration computation until the evaluation condition is satisfied. In this case, each time the process described above is repeated, the count value of the integration counter 601 of the normalization integration computation unit is incremented by 1, and the frame integration number i is incremented.

From the matters as described above, in the present integrated image being integrated, and integration processing (the integration scan and integration computation) is ended at the time when an expected image is obtained. When automatic evaluation is performed, it is possible to realize frame-integrated image acquisition without being conscious of the number of integration (it is not necessary to set the integration number). This is because an image with the luminance value which is in a state of being "1" can be output during integration by the normalization integration computation. The point of the present embodiment is that the integrated image has the luminance value which is in a state of being "1" can be output during the integration and evaluation can be performed on the integrated image with its luminance value which is in a state of being "1" during the integration.

Next, an operation flow of FIG. 12 will be described together with an operation of the screen of FIG. 10. A screen 801 includes a frame integration mode setting portion 802, a frame integration number display portion 804, an image display window 805, an image acquisition execution button 806, an evaluation method setting button 808, and an integrated image evaluation value display portion 809.

When an observation region for which a frame-integrated image is intended is determined, the user performs various settings on the screen 801 and executes image acquisition (STEP 901). In the frame integration mode setting portion 802, it is possible to select either an automatic mode or an integration number designation mode.

Figure 13:
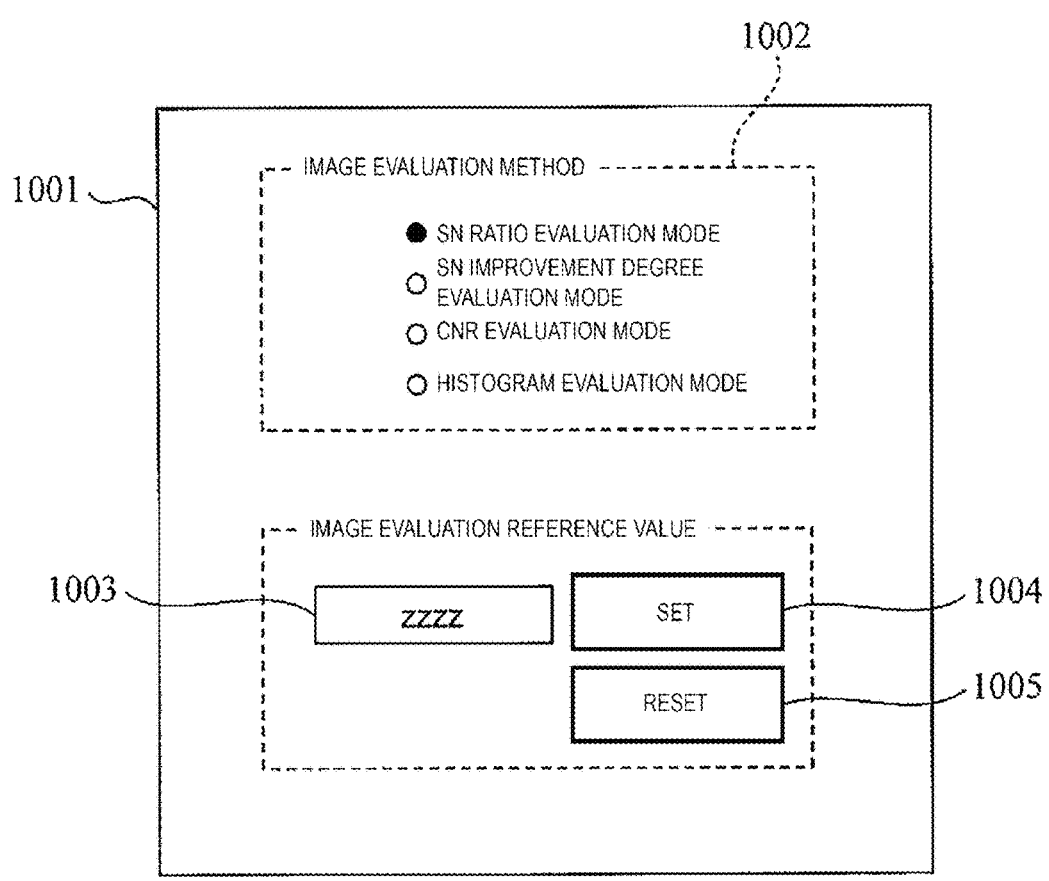
FIG. 13 is a GUI for selecting an image evaluation method of the present invention.

The automatic mode is a mode for performing automatic evaluation by the image evaluation unit 522. The user sets an image evaluation method in a case of selecting the automatic mode. The user clicks the evaluation method setting button 808. FIG. 13 illustrates an evaluation method setting window 1001. When the evaluation method setting button 808 is clicked, the evaluation method setting window 1001 is displayed. The evaluation method setting window 1001 includes an evaluation method selection portion 1002 and an evaluation reference value setting portion 1003. The user selects an evaluation method in the evaluation method selection portion 1002. Details of various evaluation methods displayed here will be described later. With this, it is possible to select an appropriate evaluation method depending on what image the user intends to acquire in image acquisition (according to the definition of the image having image quality expected by the user). Thereafter, the user inputs an evaluation reference value to the evaluation reference value setting portion 1003. The evaluation reference value input here is a threshold value for determining whether it is image quality expected by the user. The user inputs the evaluation reference value to the evaluation reference value setting portion 1003, and then clicks the setting button 1004.

The user can also reset the evaluation reference value to a default value of an apparatus device by using the reset button 1005. In this case, a default evaluation reference value stored in the information processing unit 517 may be set again in the image evaluation unit 522.

The integration number designation mode is a mode in which a frame integration number is designated in advance. In the case of the integration number designation mode, the user inputs the integration number to the integration number setting portion 803. In this case, integration processing may be executed up to a set integration number, and the integrated image may be evaluated by the user himself/herself.

After the setting described above is ended, the user clicks the image acquisition execution button 806 to obtain a frame-integrated image (STEP 902). In both the automatic mode and the integration number designation mode, the frame-integrated image is displayed in the image display window 805 for one frame. The integration number of the frame-integrated images is displayed on the frame integration number display portion 804. In a case where the automatic mode is set, an evaluation value of the selected evaluation method is displayed on the integrated image evaluation value display portion 809. With the configuration as described above, the user can confirm the frame-integrated image, the integration number, and the evaluation value for one frame.

As another example, at the time when integration processing is executed frame by frame and an integrated image displayed in the image display window 805 becomes image quality expected by the user, a function of stopping integration processing by the user's input may be provided. With this the user can stop integration processing (the integration scan and integration computation) while viewing the frame-integrated image in the integration process.

As described above, in the case of the automatic mode, the user can acquire the frame-integrated image only by the operation of "image acquisition execution" without being never conscious of the setting of the integration number. That is, it is not necessary to set the frame integration number. In conventional frame integration processing, in a case where an image having image quality expected by the user cannot be obtained, the integration number has to be set again and a plurality of image acquisition have to be executed. In contrast, in frame integration processing of the present embodiment, it is possible to acquire a frame-integrated image by one image acquisition operation. With this, it is possible to greatly improve time and effort for acquiring the frame-integrated image. It is possible to greatly reduce the time required for image acquisition.

The present embodiment has the following effects.

(a) In contrast to the conventional plural image acquisition operations, in the present embodiment, a frame-integrated image is obtained by one image acquisition operation.

(b) In the present embodiment, it is possible to perform the integration scan with the minimum required number of integration by one image acquisition operation.

(c) By both effects described above, it is possible to reduce the irradiation time of the electron beam with which the sample is irradiated as much as possible.

(d) By suppressing the amount of electron beam with which the sample is irradiated to be minimized, it is possible to obtain secondary effects that suppresses sample destruction, contamination generation, generation of luminance value saturation and drift due to the influence of charging to be minimized.

Next, the definition of the "image having image quality expected by the user" described above will be described. As an image having image quality expected by the user, for example, an image having a good SN ratio, an image in which the degree of SN improvement is saturated, an image without an influence of charge (an image without luminance value saturation due to charge, an image without drift due to charge), and the like are included. In the present embodiment, the definition of the "image having image quality expected by the user" is switched according to what image the user intends to acquire in the image acquisition.

Figure 11:
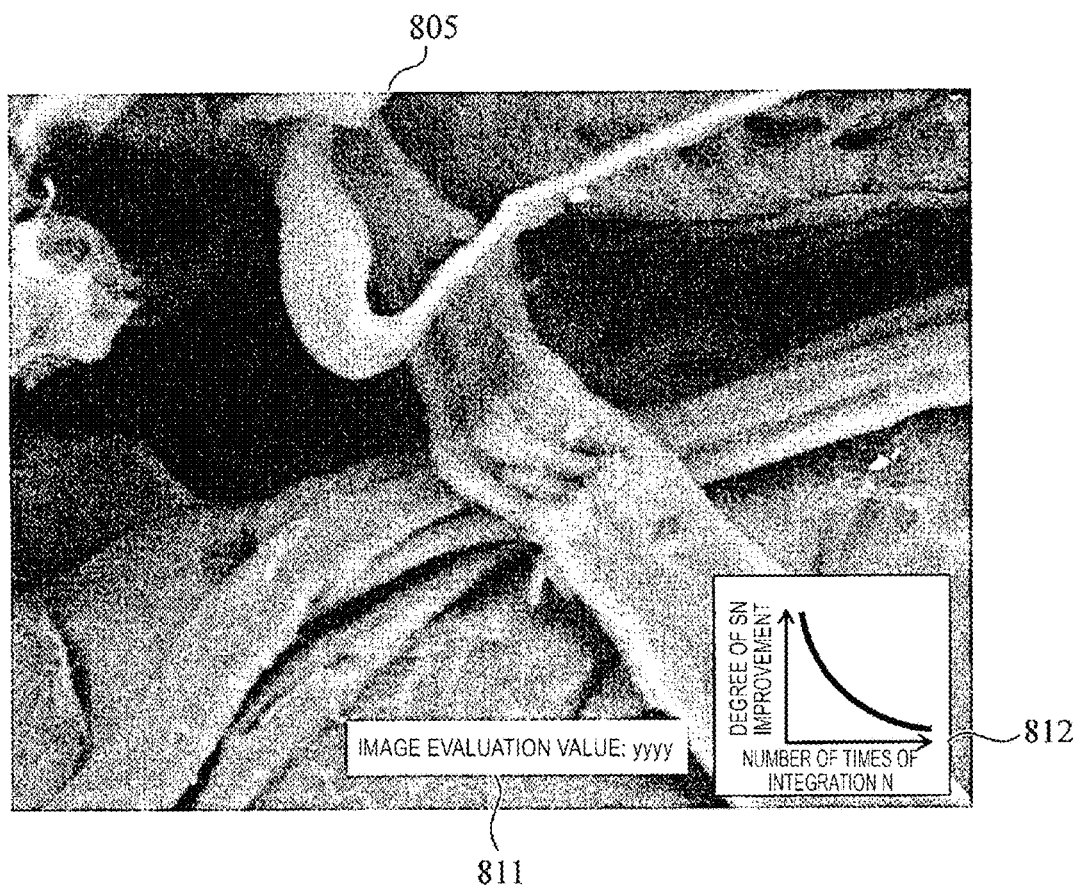
FIG. 11 is a diagram illustrating a display example of the frame-integrated image.

FIG. 11 illustrates another example of the image display window 805. Information other than the frame-integrated image may be displayed in the image display window 805. For example, an image evaluation value (numerical value) 811 and an image evaluation graph 812 to be described below may be displayed in the image display window 805.

Next, an image evaluation method will be described. An execution subject of an evaluation process described below is the image evaluation unit 522. As the image evaluation method, for example, an evaluation method using the SN ratio as an evaluation index, an evaluation method using the degree of SN improvement as an evaluation index, an evaluation method using a contrast-to-noise ratio (CNR) as an image noise evaluation index, an evaluation method using a histogram as an evaluation index, and the like are included. Accordingly, the evaluation condition of the integrated image is one of the condition using the SN ratio as the evaluation index, the condition using the degree of SN improvement as the evaluation index, the condition using the contrast-to-noise ratio (CNR) as the image noise evaluation index, the condition using the histogram as the evaluation index or a combination thereof may be adopted.

Figure 14:
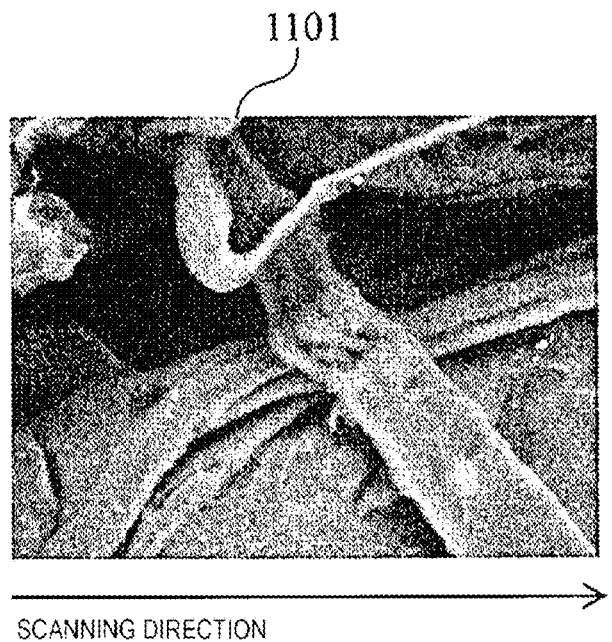
FIG. 14 is a diagram for explaining an image evaluation index (SNR).
Figure 15:
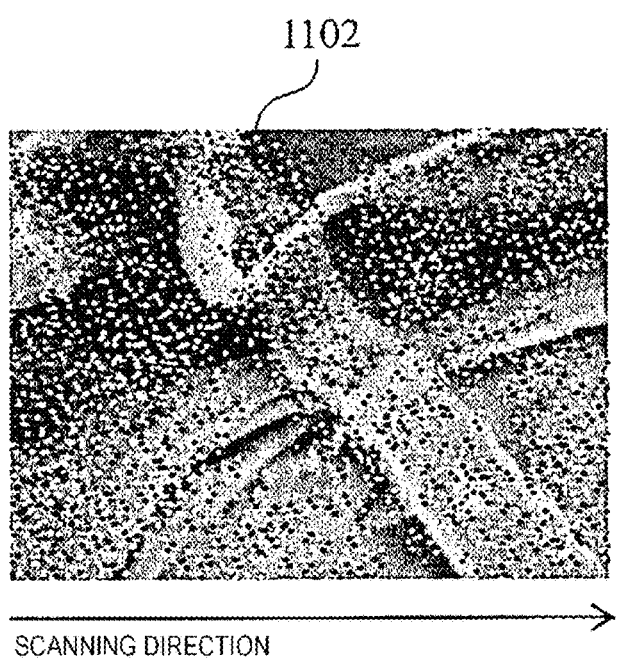
FIG. 15 is a diagram for explaining the image evaluation index (SNR).
Figures 16, 17:
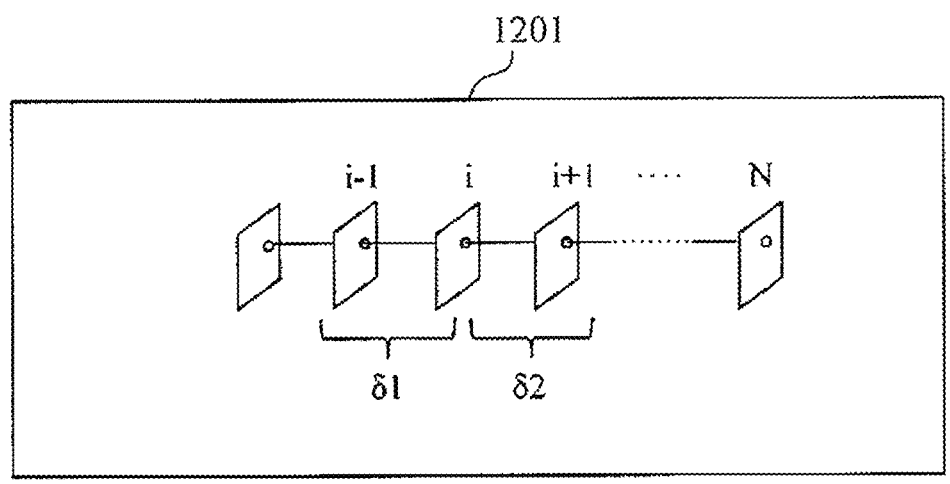
FIG. 16 is a diagram for explaining the image evaluation index (SNR).
FIG. 17 is a diagram for explaining another image evaluation index (degree of SN improvement).

FIG. 14 to FIG. 16 are diagrams for explaining the image evaluation index (SNR). In the case where the SN ratio is used as an evaluation index, an image without noise (or an image having little noise and determined as good by the user) is acquired in advance as a reference image 1101 (FIG. 14). A frame-integrated image 1102 to which the normalization integration computation described above is applied is obtained (FIG. 15). The image evaluation unit 522 calculates the SN ratio between the reference image 1101 and the frame-integrated image 1102 (FIG. 16). When the calculated SN ratio reaches a value equal to or greater than a SN ratio (evaluation reference value) by the user, the integration scan and integration computation is ended.

FIGS. 17 to 20 are diagrams for explaining the image evaluation index (degree of SN improvement). The degree of SN improvement means the degree of the difference in luminance value between the current integrated image and the integrated image one frame before. The difference value is used as an evaluation index. Matters that the difference value becomes smaller is assumed that the SN ratio of each integrated image becomes better. That is, it is a method of indirectly determining the state of the SN ratio of each integrated image by representing (quantifying) the degree of S/N ratio improvement between the integrated images by the difference value of the luminance value of the integrated image and using this difference value as an evaluation index (using the degree of SN ratio improvement as an evaluation index).

That is, the SN ratio is indirectly evaluated using the following relationship.

The SN ratio of each integrated image is improved. The luminance value of each integrated image is focused on the signal component (there is no noise component).

The luminance value difference between the integrated images becomes zero.

Figures 18, 19:
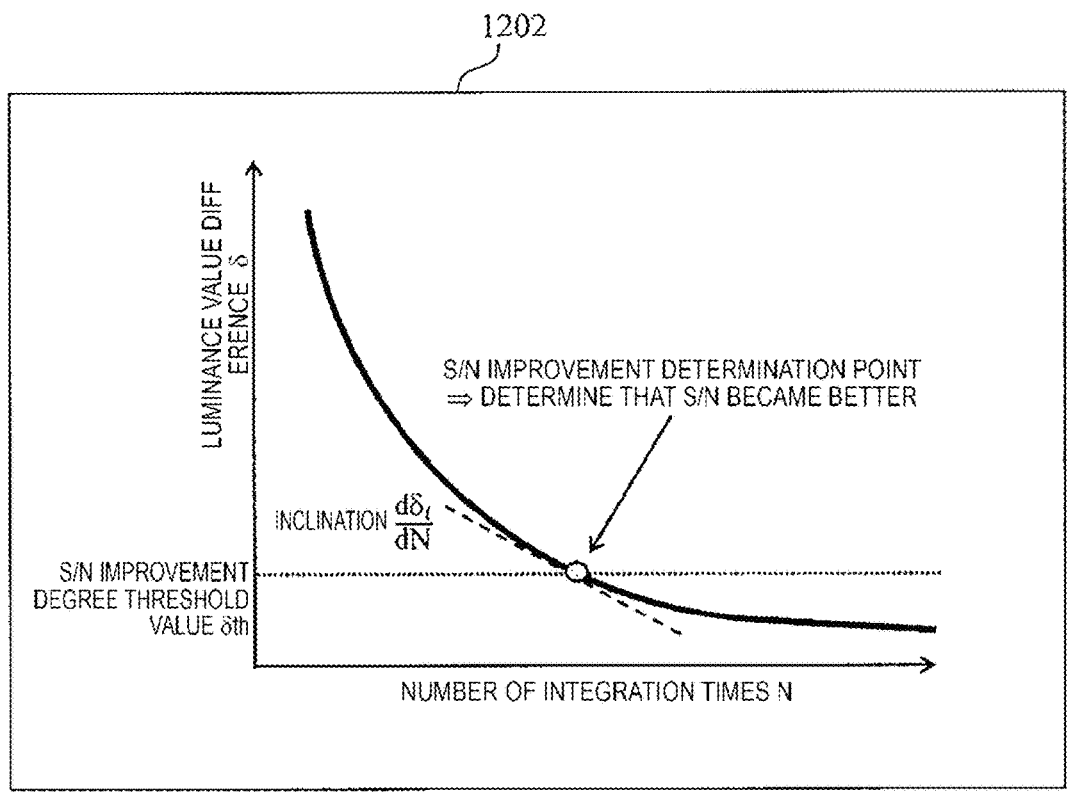
FIG. 18 is a diagram for explaining the image evaluation index (degree of SN improvement).
FIG. 19 is a diagram for explaining the image evaluation index (degree of SN improvement).

In FIG. 17, the reference numeral 1201 denotes the difference value $\delta_i$ of the luminance value between frames in the process of performing the integration processing using the integration number N. FIG. 18 illustrates an expression of the difference value $\delta_i(x, y)$ of the luminance value. $\delta_i(x, y)$ represents the difference between $S_i(x, y)$ and $S_{i-1}(x, y)$ corresponding to the x and y coordinates.

FIG. 19 illustrates a graph 1202 illustrating the relationship of the difference value of the luminance value with respect to the number of times of integration. As illustrated in the graph 1202, the image evaluation unit 522 may determine whether the difference value of the luminance value is less than a predetermined threshold value $\delta$th. The image evaluation unit 522 may use an inclination of a curve as an evaluation index, and determine whether the inclination is less than a predetermined threshold value. In a case where the conditions described above are satisfied, the integration scan and the integration computation are ended.

Figure 20:
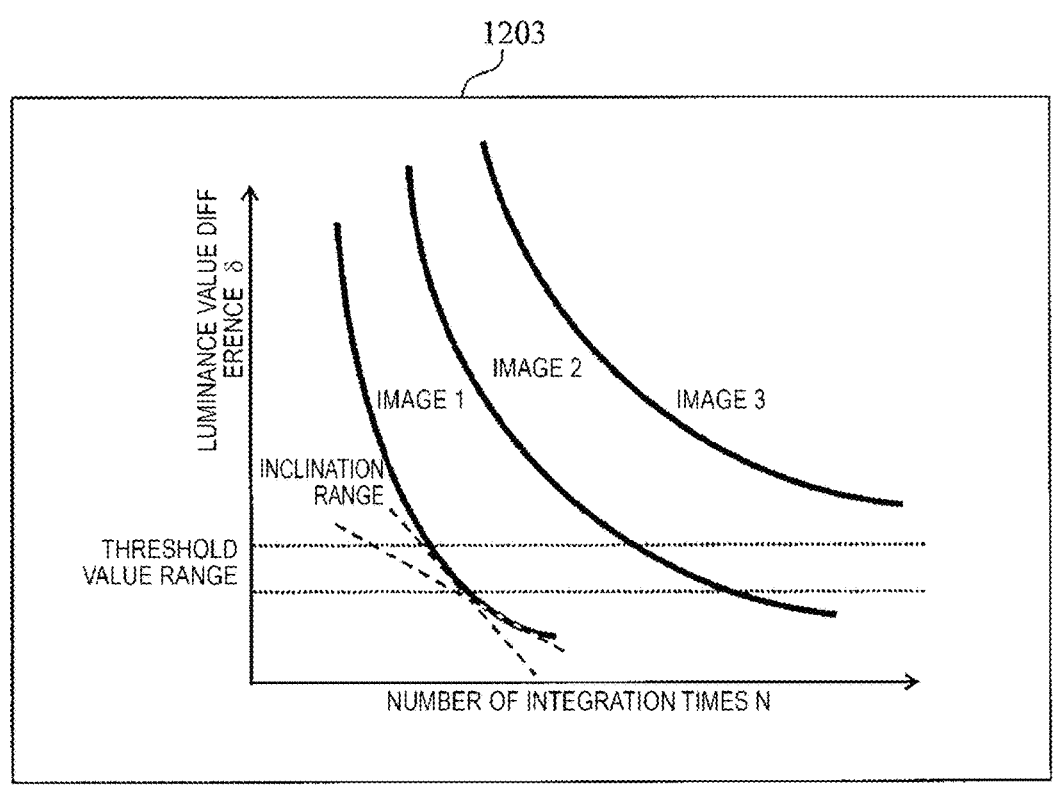
FIG. 20 is a diagram for explaining the image evaluation index (degree of SN improvement).

FIG. 20 illustrates an example 1203 in which a range is set for a threshold value. A range designation to some extent may be performed with respect to a threshold value of the difference value of the luminance value and a threshold value of the inclination. The characteristics of the relationship between the difference value of the luminance value and the number of times of integration varies depending on an observation sample and an observation condition (optical condition). Accordingly, as illustrated in FIG. 20, the evaluation reference value may not be fixed and an evaluation condition having a certain range may be set.

Figures 21, 22:
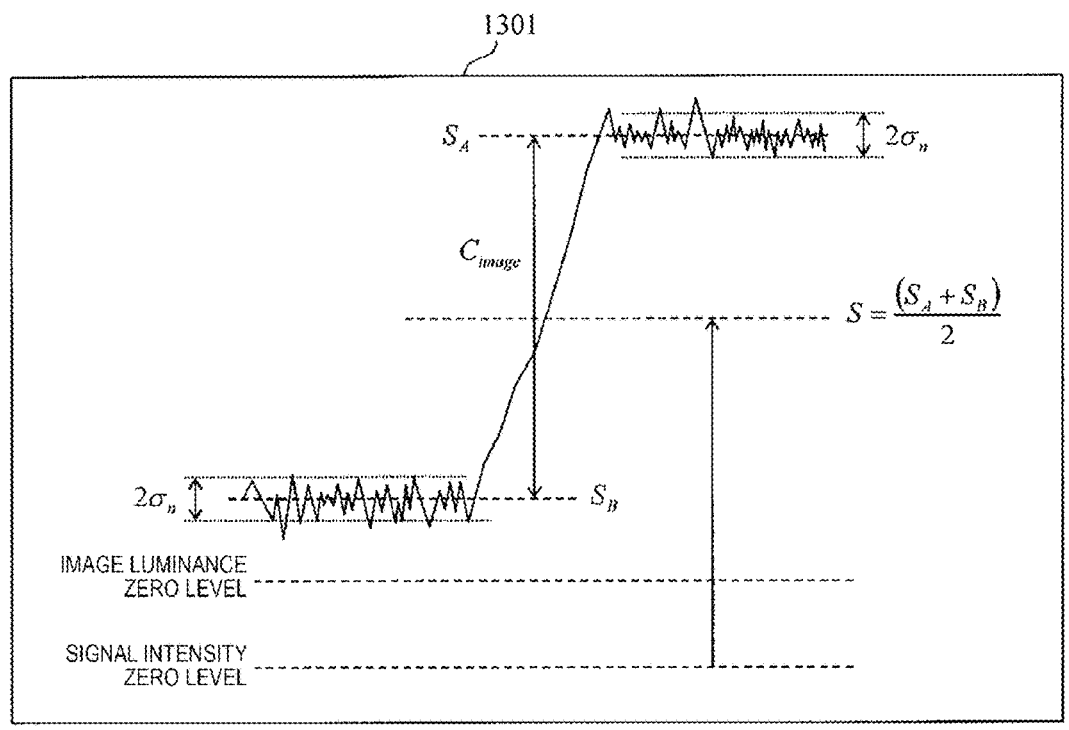
FIG. 21 is a diagram for explaining another image evaluation index (CNR).
FIG. 22 is a diagram for explaining the image evaluation index (CNR).

FIGS. 21 to 22 are diagrams for explaining the image evaluation index (CNR: Contrast-to-noise ratio). This evaluation method is a method of determining a noise amount of image using the CNR. Naturally, the detected signal is represented as a luminance value in the image. The amount of noise is evaluated by using a luminance value contrast of a noise-free signal component (grayscale difference in a luminance value between a pixel having the largest signal amount and a pixel having smallest signal amount) and luminance value variation which is the noise component. The image evaluation unit 522 may calculate the CNR in each integrated image and compare the CNR with the evaluation reference. The image evaluation unit 522 may determine that the integrated image expected by the user is acquired at the time when the CNR exceeds the evaluation reference value.

Next, a histogram evaluation method will be described. In a case where a histogram of luminance values is used as an evaluation index, a histogram representing a frequency distribution of luminance values of pixels constituting a frame image is used. The image evaluation unit 522 may evaluate at least one of the expected grayscale, the degree of noise removal, brightness, and contrast using statistical values such as an average value and standard deviation of the histogram. The image evaluation unit 522 may determine that the integrated image that is equal to or greater than the image quality expected by the user is acquired if the statistical value exceeds a fixed evaluation reference value.

Figure 23:
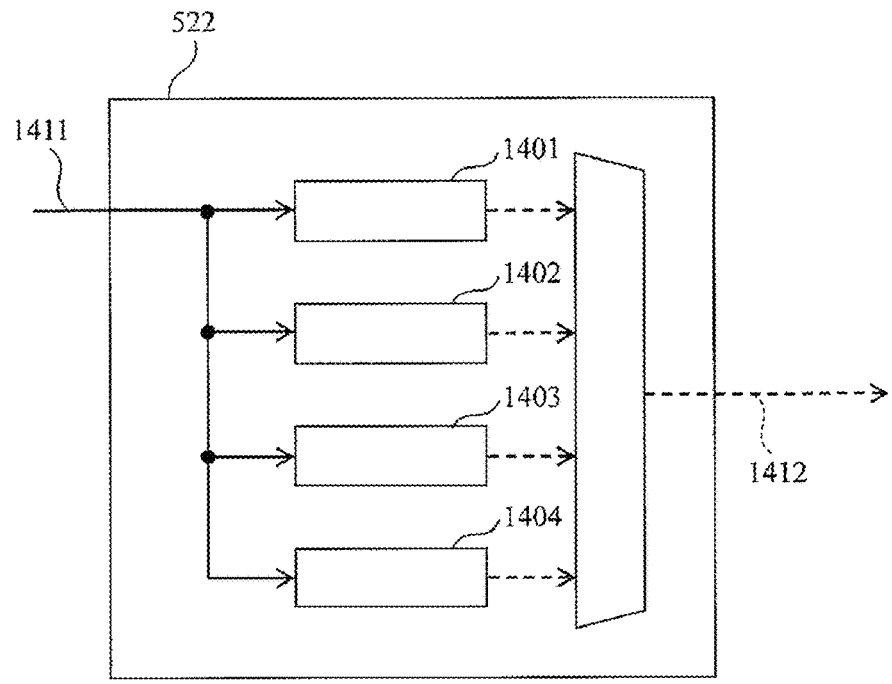
FIG. 23 is an internal configuration diagram of an image evaluation unit of the present invention.

FIG. 23 illustrates an internal configuration of the image evaluation unit 522. The image evaluation unit 522 includes the functions described in the example described above, that is, a histogram evaluation module 1401, an SN ratio evaluation module 1402, an SN improvement degree evaluation module 1403, and a CNR evaluation module 1404. The information processing unit 517 transmits an evaluation method which is set by the evaluation method selection portion 1002 to the image evaluation unit 552. The image evaluation unit 522 selects an evaluation module corresponding thereto and executes image evaluation of input integrated image data 1411. The image evaluation unit 522 returns an evaluation result 1412 to the information processing unit 517.

Although the evaluation reference value used by the image evaluation unit 522 at the time of image evaluation is prepared in the apparatus in advance, the reference value may be changed by the user. With this, it is possible to acquire a frame-integrated image that is close to an image expected by the user.

In the automatic mode, in order to avoid that the evaluation value does not reach the evaluation reference value even if integration processing is repeated and the frame-integrated image cannot be acquired forever, an upper limit value of the integration number may be set in the information processing unit 517. In a case where the upper limit value of the integration number reaches the upper limit value (in a case where a count value of the integration counter 601 reaches the upper limit value), the information processing unit 517 may forcibly end acquisition of the integrated image. For ease of use, it is also possible to consider a case the user may want to acquire an integrated image with as little noise as possible by setting the integration number to large. In this case, the upper limit of the number of integration may be set to large.

In the present embodiment, a frame normalization integration function capable of computing (outputting) the luminance value of the integrated image always in a state of "1" in the frame integration process and an image evaluation function capable of performing image evaluation of the integrated image in the frame integration process, and it is possible to automatically end the frame-integrated image acquisition process at the time when the integrated image expected by the user is obtained.

In the present embodiment, the user can confirm information on the relationship between the frame-integrated image and the integration number. This has the following advantages.

(a) It is possible to obtain reference information at the time of acquiring an image using conventional frame-integrated image acquisition (integration number designation mode).

(b) It is possible to know the relationship between occurrence of sample destruction, occurrence of contamination, luminance value saturation, and drift caused by charging and the integration number, as reference information.

(c) It is possible to know the relationship between the integration number and image evaluation information, and the relationship between the integration number and the degree of improvement in the integration process.

Figure 24:
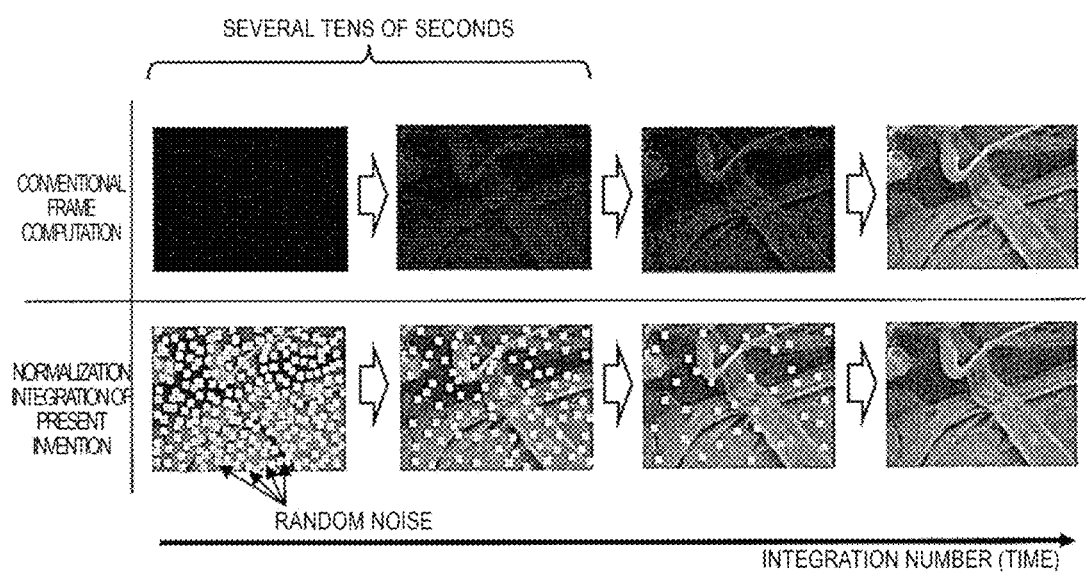
FIG. 24 is a diagram for explaining a comparison between integrated image display in an integration process of the prior art and that of the present invention.

FIG. 24 is a diagram for explaining the effect of display in the frame integration process of the present embodiment. In the frame normalization integration computation of the present embodiment, an integrated image of luminance value "1" even during integration can be output. Conventionally, when acquisition of a frame-integrated image having a large number of integration numbers is performed, in image display being integrated, as illustrated in the upper part of FIG. 24, dark display continues for a long time period of several tens of seconds from the start of integration, there was a problem of giving a sense of discomfort to the user. In contrast, in the frame normalization integration computation of the present embodiment, since the integrated image in the state of having the luminance value can be "1" instantaneously displayed from the first start of integration, as illustrated in the lower part of FIG. 24, image display without giving a sense of discomfort to the user is possible.

Conventionally, since the luminance value at the start of integration is not "1" as described above, it was image display by which it was difficult to confirm the S/N improvement process by integration computation. In contrast, in the present embodiment, the S/N improvement process can also be confirmed and usability is further improved.

[Second Embodiment]

In this embodiment, an example in which the frame-integrated image acquisition function of the first embodiment is applied to an extremely low magnification image creation function will be described.

In general, an electron microscope such as an SEM is effective for observation at high magnification, but display with low magnification is not good. The magnification of the electron microscope can be displayed at a maximum of several ten thousand times to several hundreds of thousands times or several million times, whereas the lowest magnification is on the order of several times to several tens of times. For example, the lowest magnification observable with the SEM is generally about 5 to 50 times. If the whole sample can be observed at lowest magnification, the viewing field search can be gradually shifted to high magnification from the state in which the viewing field is widened, that is, from the state in which it is displayed at low magnification, and gradually narrows the viewing field. However, if the entire sample cannot be observed even at the lowest magnification, it is necessary to move the stage and perform the viewing field search, and a work to finally find a place intended to be observed on the sample becomes difficult.

Accordingly, PTL 6 has been proposed as a solution method for the viewing field search in a condition that the entire region of the sample cannot be observed even at the lowest magnification. This is to divide the sample into a plurality of regions, acquire respective observation images, and join the observation images on a memory so as to create an extremely low magnification image of the entire sample, thereby overcoming the problem described above. Firstly, this overview will be described.

Since an example of a configuration of the charged particle beam apparatus described here is the same as that in FIG. 1, the description thereof will be omitted. Further, frame integration processing here is the same as that described in FIGS. 2 and 3.

Figure 25:
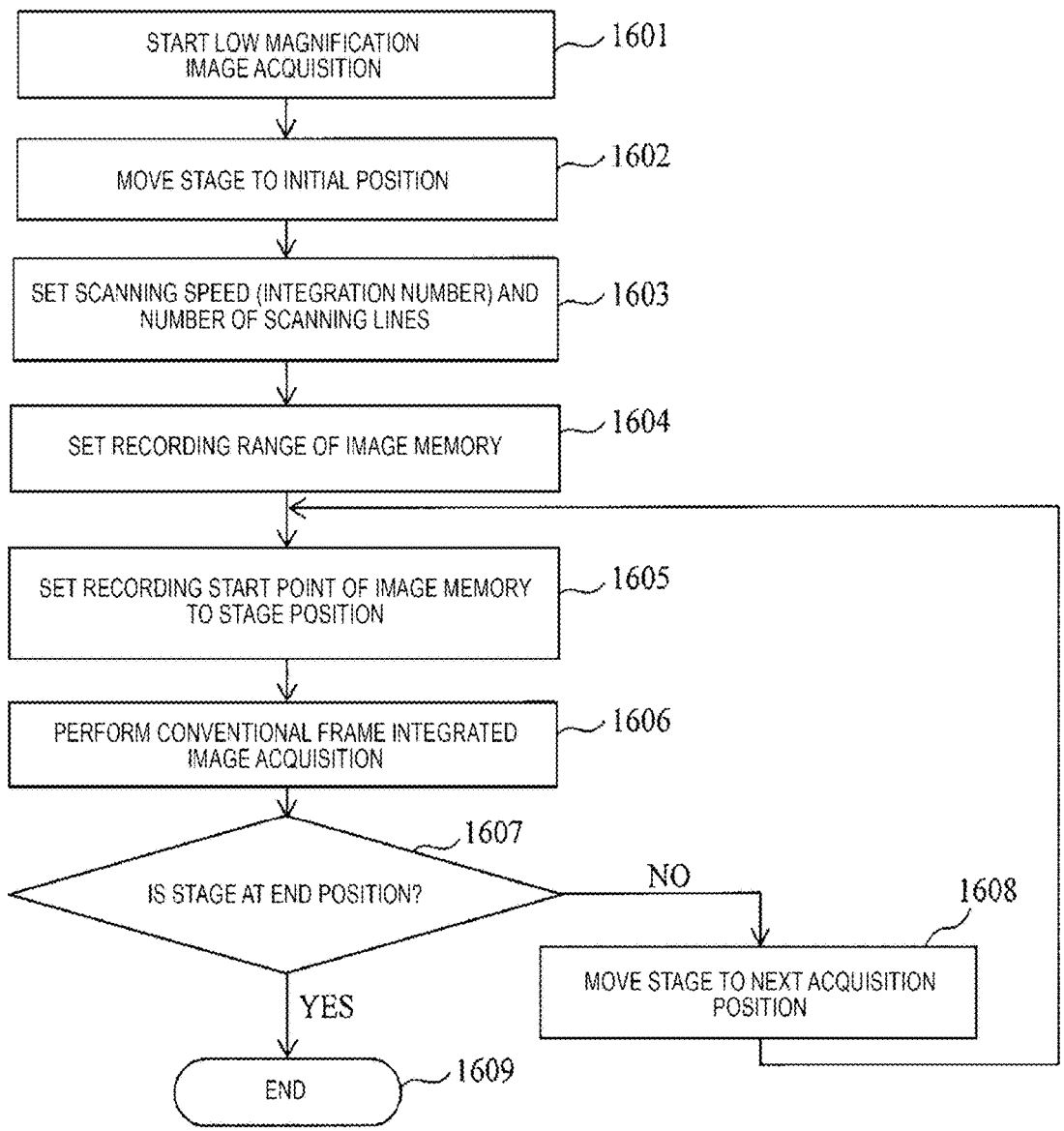
FIG. 25 is a flowchart for explaining a processing flow of extremely low magnification image acquisition in which a conventional frame-integrated image acquisition function is implemented.
Figure 26:
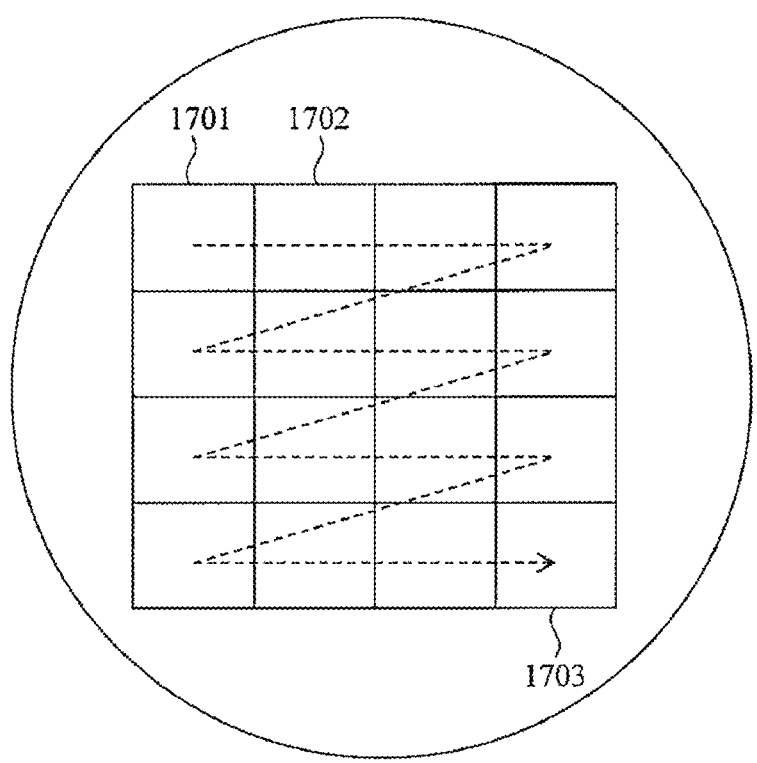
FIG. 26 is a diagram for explaining an outline of scanning of extremely low magnification image acquisition in which the conventional frame-integrated image acquisition function is implemented.
Figure 27:
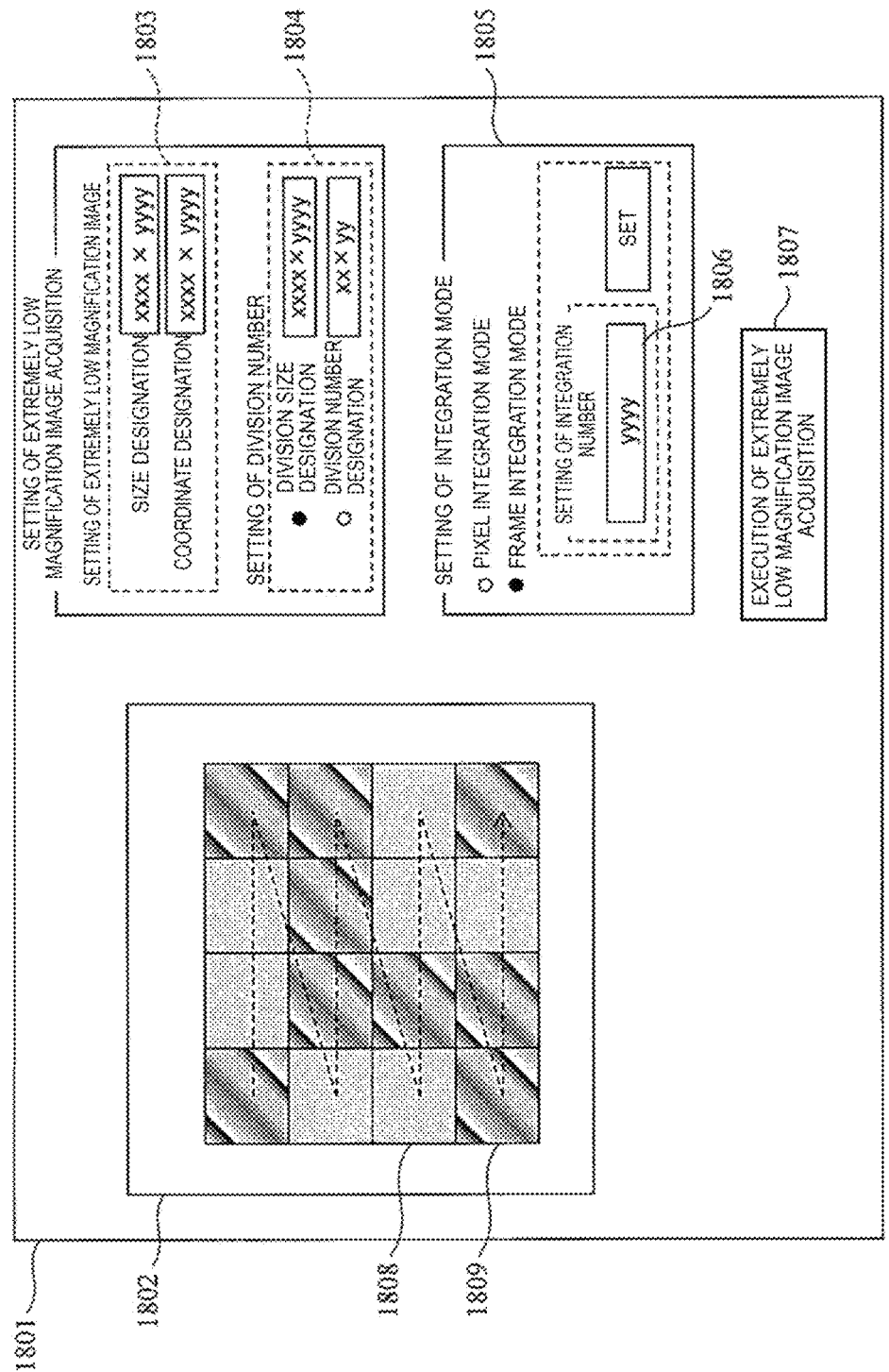
FIG. 27 is a GUI when the conventional extremely low magnification image is acquired.

FIG. 25 illustrates a processing flow of creating a conventional extremely low magnification image, and FIG. 26 illustrates an outline of scanning of creating an extremely low magnification image. FIG. 27 illustrates a GUI for acquiring an extremely low magnification image.

A screen 1801 is displayed on the display device of the information transmission apparatus 121. The user decides the observation region for which the frame-integrated image is intended to be acquired, performs various setting, and then executes low magnification image acquisition (STEP 1601). When an execution instruction is received, the information processing unit 117 moves the sample stage (stage) 108 to the initial coordinates via the stage control unit 118 based on coordinate data set on the screen 1801 (STEP 1602).

Next, the information processing unit 117 sets the coefficient K1 of the multiplier 115 based on the frame integration number set on the screen 1801. The information processing unit 117 sets the scanning speed (integration number) and the number of scanning lines in the deflection control unit 119 (STEP 1603). Next, the information processing unit 117 sets a recording range of the frame memory 114 (STEP 1604). The information processing unit 117 sets a recording start point of the frame memory 114 in a region corresponding to the stage position (STEP 1605).

Next, the image processing unit 113 executes conventional frame integration processing (FIGS. 2 and 3) and stores the frame-integrated image in the frame memory 114 (STEP 1606). FIG. 26 illustrates an example in which the sample is divided into a plurality of regions. In this example, the sample is divided into 16 regions. An image acquisition target region at this time is region 1 (1701). The image processing unit 113 performs conventional frame integration processing (FIG. 2 and FIG. 3) for the region 1 (1701).

When the frame-integrated image acquisition is completed, the information processing unit 117 confirms whether the stage position is the final region 16 (1703) or not (STEP 1607). In a case where it is the final region 16 (1703), acquisition of the extremely low magnification image is ended (STEP 1609).

Since the frame-integrated image of the region 1 (1701) is now acquired, the information processing unit 117 moves the stage to the next region 2 (1702) via the stage control unit 118 (STEP 1608).

Thereafter, STEP 1605 to STEP 1608 are repeated until the frame-integrated image of region 16 (1703) is acquired. For example, as illustrated in FIG. 26, the image processing unit 113 acquires frame-integrated images along the order of dotted arrows. After the frame-integrated image of the entire region is acquired, the information processing unit 117 transfers image data of the entire region to the information transmission apparatus 121.

Figure 28:
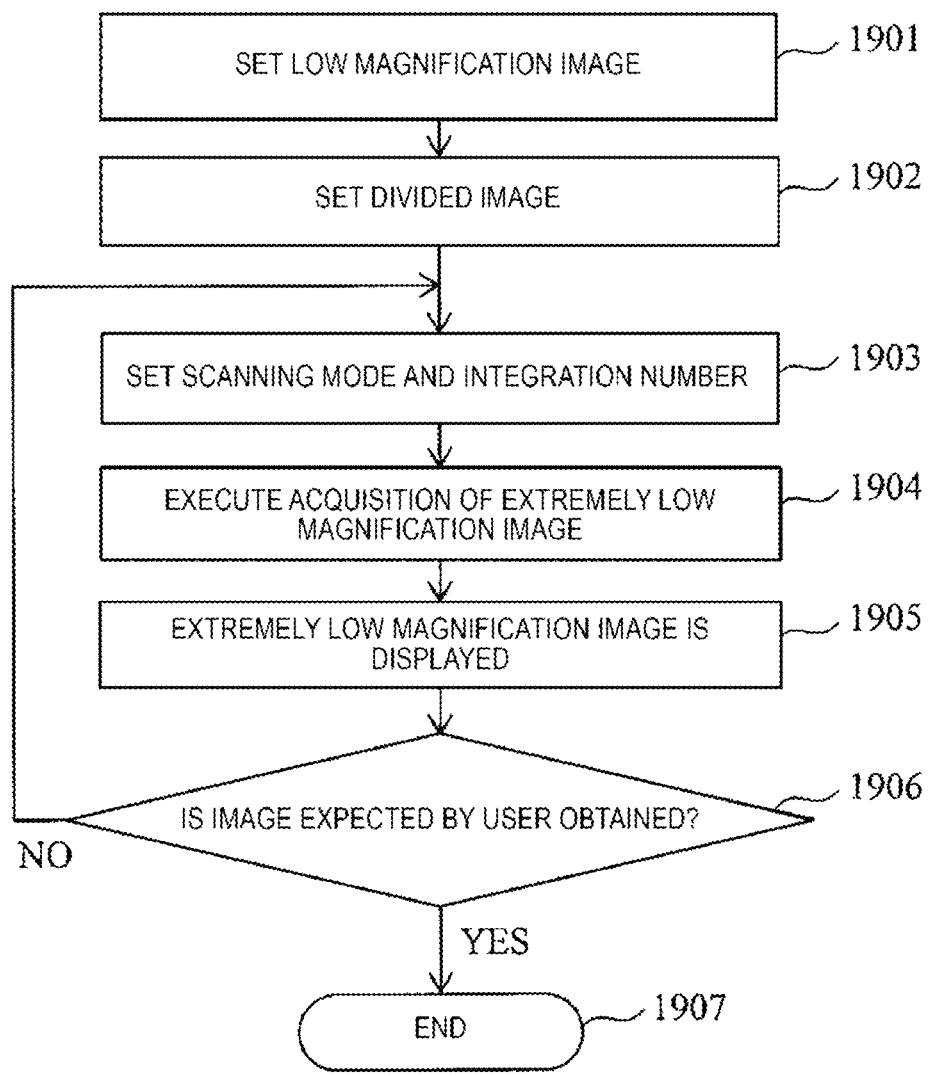
FIG. 28 is a flowchart for explaining an operation procedure of the conventional extremely low magnification image acquisition.

Next, the operation flow of FIG. 28 will be described together with the operation of the screen of FIG. 27. The screen 1801 includes an image display window 1802, an extremely low magnification image setting portion 1803, a division number setting portion 1804, an integration mode setting portion 1805, and an image acquisition execution button 1807.

When the observation region for which an extremely low magnification image is intended to be determined is determined, the user sets the size and coordinates of the extremely low magnification image in the extremely low magnification image setting portion 1803 (STEP 1901). Next, the user sets the division number of the image in the division number setting portion 1804. In the present example, the division number is set to 16 (STEP 1902). The user may set the size of the divided image in the division number setting portion 1804. In this case, the region which is set in the extremely low magnification image setting portion 1803 is divided by the designated image size.

Next, a scanning method of the divided image is set. In general, as a method of integrating images, there are a method of integrating in continuous time in pixel units and a method of integrating in units of frames. In this example, since frame integration becomes a target, a case of setting the frame integration number is described. The user selects the frame integration mode in the integration mode setting portion 1805, and sets the integration number in the integration number setting portion 1806 (STEP 1903). Accordingly, the same integration number is set for all the divided regions. The number of scanning lines and the size of the horizontal pixel when acquiring a divided image are the same as those described in PTL 6. The information processing unit 117 automatically calculates the number of scanning lines and the horizontal pixel size based on information of the division number setting portion 1804.

When various setting described above is completed, the user clicks the image acquisition execution button 1807 to execute acquisition of the extremely low magnification image (STEP 1904). When the frame-integrated images of all the divided regions are acquired by the flow described in FIG. 25, the information processing unit 117 transfers these frame-integrated images to the display device of the information transmission apparatus 121. The extremely low magnification image is displayed on the image display window 1802 (STEP 1905). As illustrated in FIG. 27, in the image display window 1802, the frame-integrated images of all the divided regions are displayed in a form joined together.

Next, the user confirms the extremely low magnification image of the image display window 1802 (STEP 1906). Here, in a case where the obtained extremely low magnification image is an image having image quality expected by the user, acquisition of the low magnification image is ended (STEP 1907). On the other hand, in a case where the acquired extremely low magnification image is not an image having image quality expected by the user, the integration number needs to be set again to acquire the frame-integrated image of the region which becomes a target. In FIG. 27, an image having image quality that is not expected by the user is acquired in a divided region 1808, and an image having an image quality expected by the user is acquired in another divided region 1809. As such, when an image that is not expected by the user is included in the extremely low magnification image, the integration number needs to be set again to acquire the frame-integrated image of the region which becomes the target. That is, the user needs to repeat STEP 1903 to STEP 1906 until an extremely low magnification image to be expected is obtained.

In this example, the same integration number is uniformly set for all the divided regions, but a method of setting the integration number for each region is also conceivable. However, as described above, the frame integration number to be set is greatly influenced by the composition elements and structures of the sample, and observation conditions (accelerating voltage, irradiation yield, degree of vacuum, WD, and the like). For that reason, it is difficult to ascertain the optimum integration number considering the structure of the sample and observation condition in advance when the frame-integrated image is acquired. Accordingly, conventionally, cases where the operations of STEP 1903 to STEP 1906 are repeated to obtain the optimum integration number to acquire the frame-integrated image often occur.

As a result, conventionally, there were the following problems.

(a) It takes time and effort to perform repetitive image acquisition.

(b) Since image acquisition is repeatedly performed, the image acquisition time increases.

(c) The electron beam irradiation time for the sample is increased (electron beam irradiation amount increases) by the (b). There is a high possibility of causing secondary problems such as an increase in the amount of electron beams with which the sample is to be irradiated, causing sample destruction, causing occurrence of contamination, and charging the sample. In particular, as the number of divided regions M increases, the above problem increases by M times.

In the following, embodiments for solving the above problem will be described. An example of the charged particle beam apparatus configuration according to the present embodiment is the same as that in FIG. 6 and thus, description thereof is omitted. Frame integration processing here is the same as that described with reference to FIGS. 7 and 8.

In the following description, a scanning electron microscope, which is an example of a charged particle beam apparatus, will be described as an example, but is not limited thereto. The present invention can also be applied to other charged particle beam devices such as an ion beam device for combining secondary signals such as images to form a combined signal.

Means for realizing an image processing part in the following embodiment may be subjected to function realization by software or by hardware. In the following example, function realization by hardware will be described.

Each of the plurality of divided regions in the sample 507 is irradiated with the electron beam 503 in the electron beam optical system and the image processing unit 513 outputs the integrated image obtained by the normalization integration computation with respect to each of the plurality of divided regions. The image processing unit 513 updates the integrated image on the display unit of the information transmission apparatus 521 according to the number of times of execution of integration processing (normalization integration computation) for each of the plurality of divided regions. The image processing unit 513 determines the end of integration processing according to image quality of the integrated image for each of the plurality of divided regions.

In detail, the image processing unit 513 repeatedly executes the normalization integration computation until the evaluation condition for each of the plurality of divided regions is satisfied. That is, after an image having image quality expected by the user is obtained for one divided region, it moves to the next divided region. Since the image evaluation is performed in each of the plurality of divided regions and the end of the normalization integration computation is determined, there is a case where the number of times of execution (that is, the integration number of integrated images) of the normalization integration computation is different among the plurality of divided regions.

Figure 29:
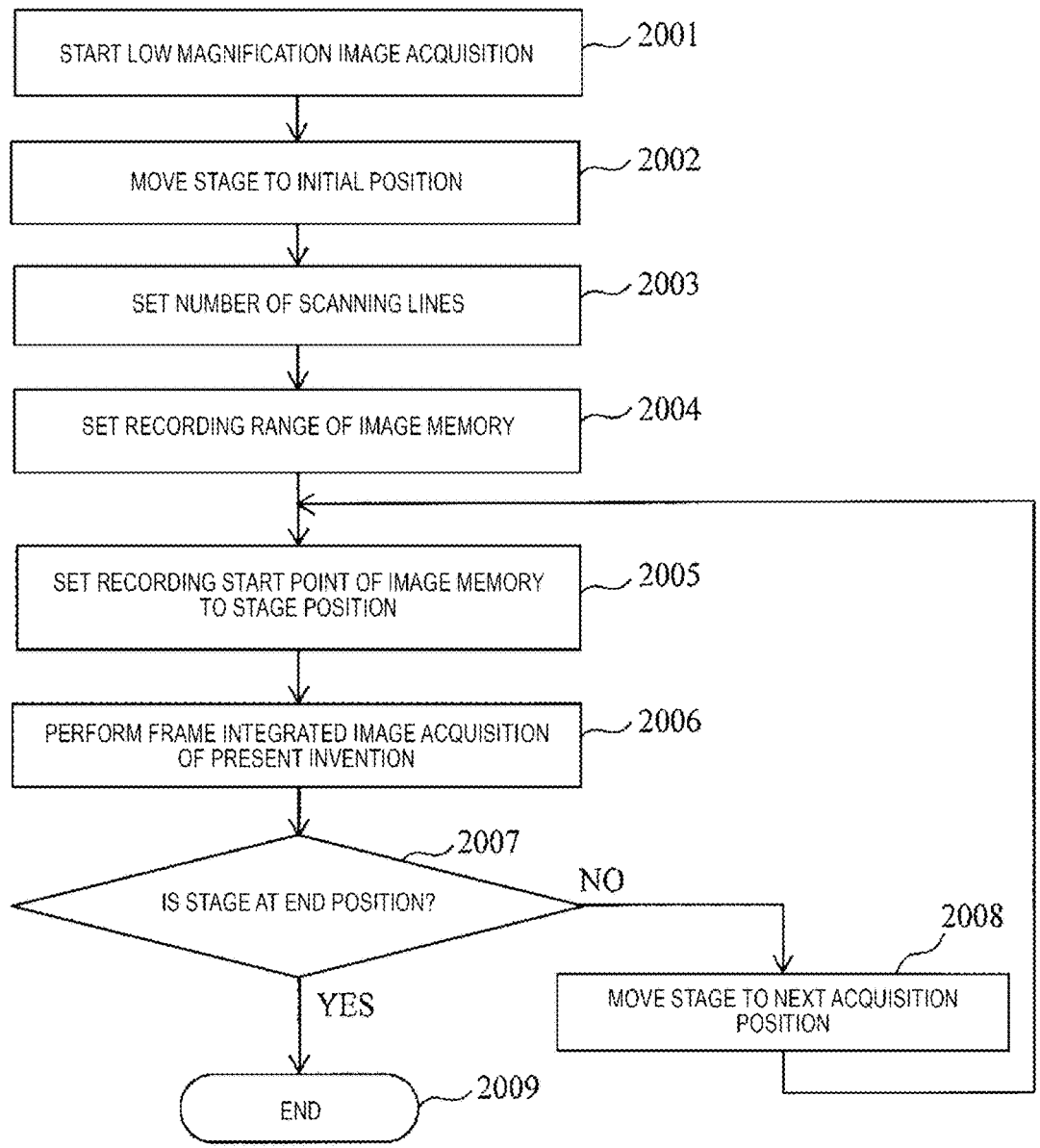
FIG. 29 is a flowchart illustrating a processing flow of extremely low magnification image acquisition in which frame-integrated image acquisition function of the present invention is implemented.
Figure 30:
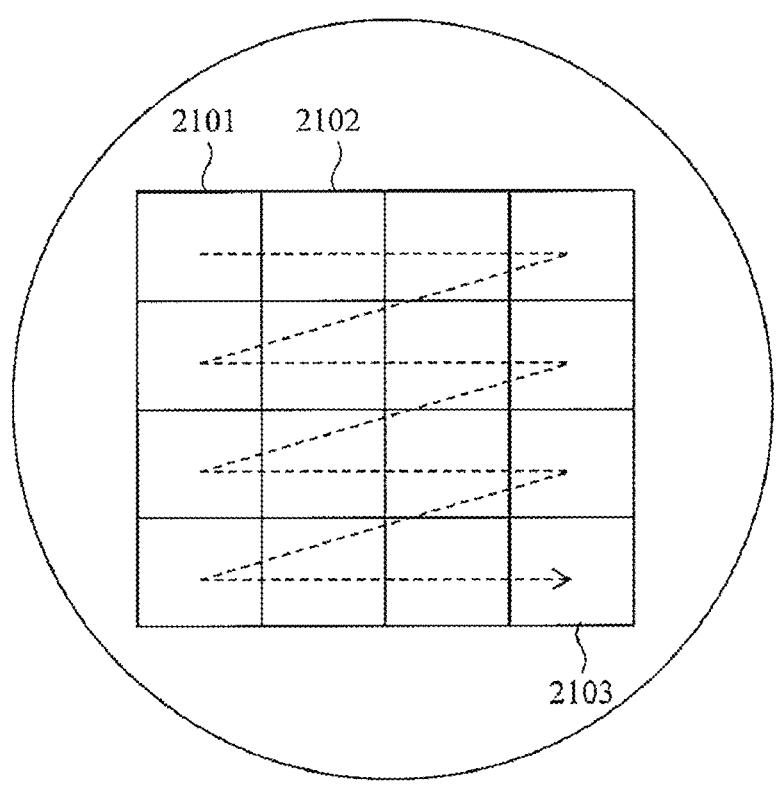
FIG. 30 is a diagram for explaining an outline of scanning of extremely low magnification image acquisition in which the frame-integrated image acquisition function of the present invention is implemented.
Figure 31:
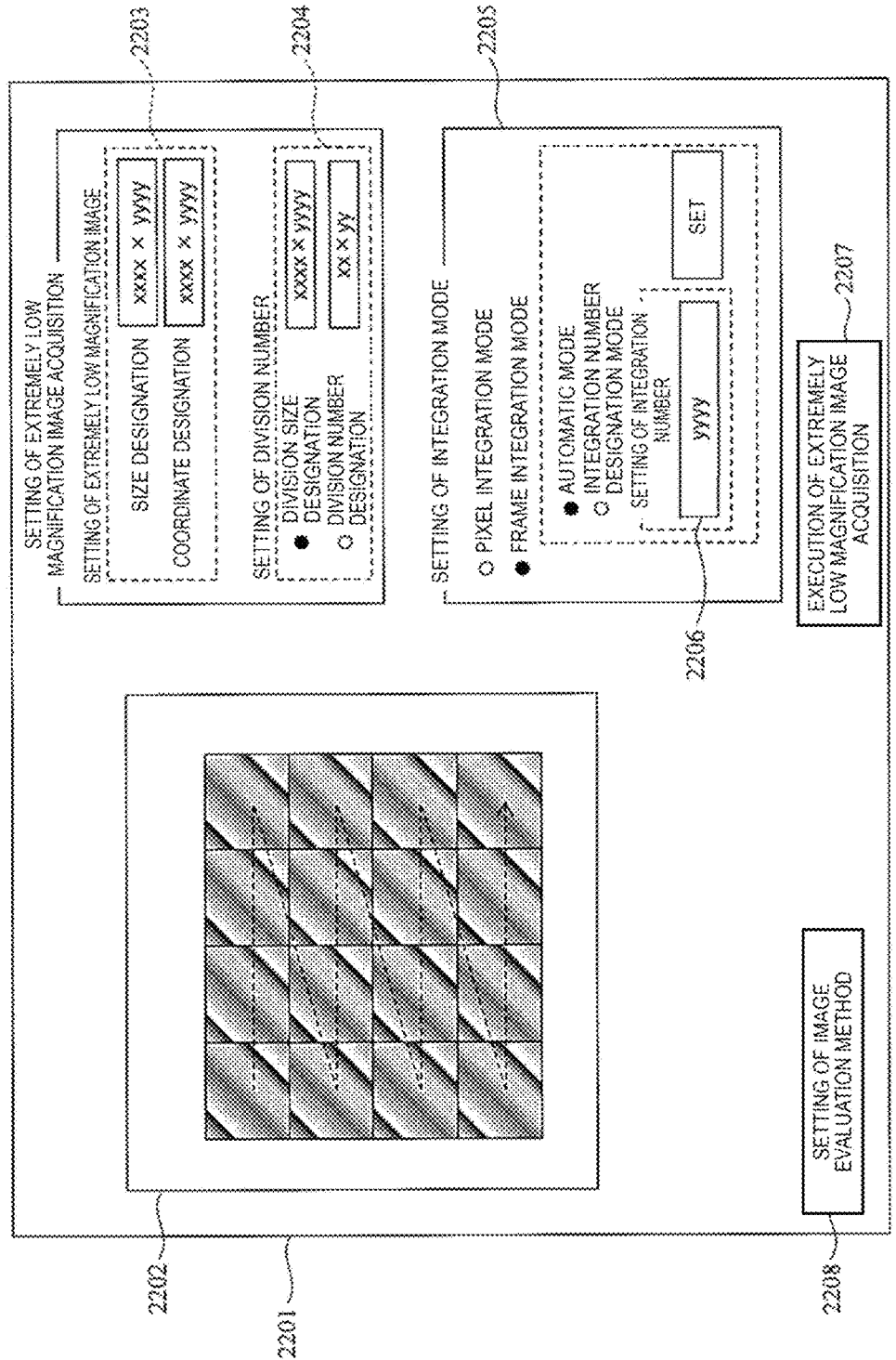
FIG. 31 is the GUI when the extremely low magnification image of the present invention is acquired.
Figure 32:
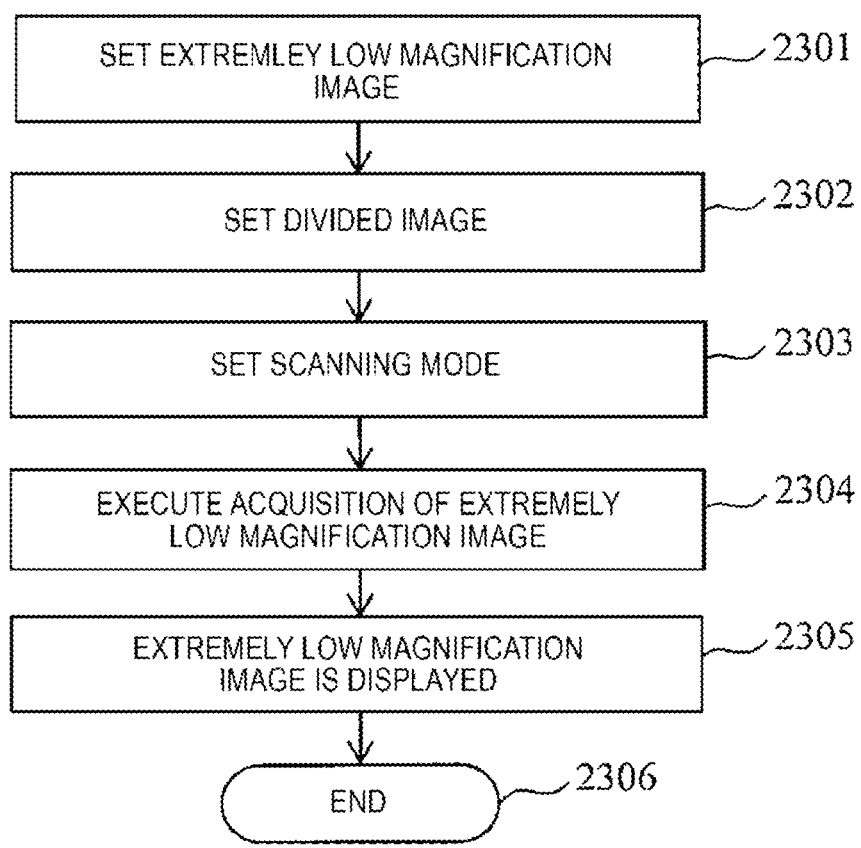
FIG. 32 is a flowchart for explaining an operation procedure of extremely low magnification image acquisition of the present invention.

FIG. 29 illustrates the processing flow for creating an extremely low magnification image according to the present embodiment, and FIG. 30 illustrates the outline of scanning for creating the extremely low magnification image. FIG. 31 illustrates a GUI when the extremely low magnification image is acquired and FIG. 32 illustrates an operation flow when an extremely low magnification image is obtained.

A screen 2201 is displayed on the display device of the information transmission apparatus 521. The user decides the observation region for which the frame-integrated image is intended to be acquired, performs various setting, and then executes low magnification image acquisition (STEP 2001). When an execution instruction is received, the information processing unit 517 moves the sample stage (stage) 508 to the initial coordinates via the stage control unit 518 based on coordinate data set on the screen 2201 (STEP 2002).

Next, the information processing unit 517 sets the number of scanning lines in the deflection control unit 519 (STEP 2003). Next, the information processing unit 517 sets the recording range of the frame memory 514 (STEP 2004). The information processing unit 517 sets the recording start point of the frame memory 514 in the region corresponding to the stage position described above (STEP 2005).

Next, the image processing unit 513 executes the frame normalization integration computation (FIGS. 7 and 8) described in the first embodiment, and stores the frame-integrated image in the frame memory 514 (STEP 2006). FIG. 30 illustrates an example in which the sample is divided into a plurality of regions. In this example, the sample is divided into 16 regions. The image acquisition target region at this time is region 1 (2101). The image processing unit 513 executes the frame normalization integration computation (FIGS. 7 and 8) described in the first embodiment for the region 1 (2101).

When the frame-integrated image acquisition is completed, the information processing unit 517 confirms whether the stage position is the final region 16 (2103) or not (STEP 2007). In a case where it is the final region 16 (2103), acquisition of the extremely low magnification image is ended (STEP 2009).

Since the frame-integrated image of the region 1 (2101) is now acquired, the information processing unit 517 moves the stage to the next region 2 (2102) via the stage control unit 118 (STEP 2008).

Thereafter, STEP 2005 to STEP 2008 are repeated until the frame-integrated image of region 16 (2103) is acquired. For example, as illustrated in FIG. 30, the image processing unit 513 acquires frame-integrated images along the order of dotted arrows. In this example, after the frame-integrated image of the entire region is acquired, the information processing unit 517 transfers image data of the entire region to the information transmission apparatus 521. As another example, the information processing unit 517 may transfer the frame-integrated image to the information transmission apparatus 521 every time the frame normalization integration computation is completed. As another example, the information processing unit 517 may transfer the frame-integrated image to the information transmission apparatus 521 when the frame normalization integration computation is completed in one divided region (at the time when the image having image quality expected by the user is obtained).

Next, the operation flow of FIG. 32 will be described together with the operation of the screen of FIG. 31. The screen 2201 includes an image display window 2202, an extremely low magnification image setting portion 2203, a division number setting portion 2204, an integration mode setting portion 2205, an image acquisition execution button 2207, and an evaluation method setting button 2208.

When the observation region for which an extremely low magnification image is intended to be determined is determined, the user sets the size and coordinates of the extremely low magnification image in the extremely low magnification image setting portion 2203 (STEP 2301). Next, the user sets the division number of the image in the division number setting portion 2204. In the present example, the division number is set to 16 (STEP 2302). The user may set the size of the divided image in the division number setting portion 2204. In this case, the region which is set in the extremely low magnification image setting portion 2203 is divided by the designated image size.

Next, a scanning method of the divided image is set. In general, as a method of integrating images, there are a method of integrating in continuous time in pixel units and a method of integrating in units of frames. In this example, since frame integration becomes a target, a case of setting the frame integration number is described. The user selects the frame integration mode and sets the integration number in the integration number in the integration mode setting portion 2205 (STEP 2303). The number of scanning lines and the size of the horizontal pixel when acquiring a divided image are the same as those described in PTL 6. The information processing unit 517 automatically calculates the number of scanning lines and the horizontal pixel size based on information of the division number setting portion 2204.

In the integration mode setting portion 2205, it is possible to select either the automatic mode or the integration number designation mode. The automatic mode is a mode for performing automatic evaluation by the image evaluation unit 522. The user sets an image evaluation method in a case of selecting the automatic mode. The user clicks the evaluation method setting button 2208. The window displayed when the evaluation method setting button 2208 is clicked is the evaluation method setting window 1001 illustrated in FIG. 13. The method of selecting the evaluation method is the same as that of the first example, and thus description thereof will be omitted.

The integration number designation mode is a mode in which a frame integration number is designated in advance. In the case of the integration number designation mode, the user inputs the integration number to the integration number setting portion 2206. In this case, integration processing may be executed up to the set integration number, and the integrated image may be evaluated by the user himself/herself. As another example, at the time when integration processing is executed frame by frame and an integrated image displayed in the image display window 2202 becomes image quality expected by the user, a function of stopping integration processing by the user's input and moving to the next divided region may be provided.

When various setting described above is completed, the user clicks the image acquisition execution button 2207 to execute acquisition of an extremely low magnification image (STEP 2304). When the frame-integrated images of all the divided regions are acquired by the flow described in FIG. 29, the information processing unit 517 transfers these frame-integrated images to the display device of the information transmission apparatus 521. In the image display window 2202, the extremely low magnification image is displayed (STEP 2305). As illustrated in FIG. 31, in the image display window 2202, frame-integrated images of all the divided regions are displayed in a form of being joined together. Here, the frame-integrated image of each divided region is evaluated by the selected evaluation method and is integrated until the evaluation reference value is satisfied. Accordingly, in all the divided regions of the image display window 2202, images having image quality expected by the user are acquired. By the operation described above, acquisition of the extremely low magnification image is ended (STEP 2306).

On the screen 2201, the number of times of executions (that is, the integration number) of frame normalization integration computation of each divided region, the evaluation value of each divided region, and the like may be displayed. The user can confirm the difference in the number of times of execution of the normalization integration computation among the plurality of divided regions, the difference in the evaluation value among the plurality of divided regions, and the like.

In the conventional extremely low magnification image acquisition, in a case where the displayed extremely low magnification image is confirmed and an image which does not have image quality expected by the user is included, it is necessary to set the integration number again and repeatedly acquire the repeated integrated image. In contrast, in the present embodiment, similarly as in the first embodiment, it is possible to acquire an extremely low magnification image having image quality expected by the user by one image acquisition operation.

As illustrated in the operation flow illustrated in FIG. 32, the user can acquire the extremely low magnification image only by the operation of "image acquisition execution" without being never conscious of the setting of the integration number. With this, it is possible to greatly improve time and effort for acquiring the extremely low magnification image. The time spent on image acquisition can also be greatly reduced.

The present embodiment has the following effects.

(a) In contrast to the conventional plural image acquisition operations, in the present embodiment, a frame-integrated image is obtained by one image acquisition operation.

(b) In the present embodiment, it is possible to perform the integration scan with the minimum required number of integration by one image acquisition operation.

(c) By both effects described above, it is possible to reduce the irradiation time of the electron beam with which the sample is irradiated as much as possible.

(d) By suppressing the amount of electron beam with which the sample is irradiated to be minimized, it is possible to obtain secondary effects that suppresses sample destruction, contamination generation, generation of luminance value saturation and drift due to the influence of charging to be minimized.

In a case where it is applied to the extremely low magnification image acquisition function, the effects described above increases by M times according to the number M of division regions.

In the automatic mode, in order to avoid that the evaluation value does not reach the evaluation reference value even if integration processing is repeated and the frame-integrated image cannot be acquired forever, an upper limit value of the integration number may be set in the information processing unit 517. In a case where the upper limit value of the integration number reaches the upper limit value (in a case where a count value of the integration counter 601 reaches the upper limit value), the information processing unit 517 may forcibly end acquisition of the integrated image. For ease of use, it is also possible to consider a case the user may want to acquire an integrated image with as little noise as possible by setting the integration number to large. In this case, the upper limit of the number of integration may be set to large.

In the present embodiment, when the frame-integrated images of all the divided regions are acquired, the information processing unit 517 transfers image data of all the divided regions to the information transmission apparatus 521. The transferred image data is displayed on the image display window 2202. As another example, the information processing unit 517 may transfer image data to the information transmission apparatus 521 at the time when acquisition of the frame-integrated image of each division region is completed. The transferred image data of each divided region may be sequentially displayed in the image display window 2202. By adopting this display system, the user can know the acquisition situation of extremely low magnification image acquisition and the difference in frame integration number for each division region, thereby improving usability for a user.

[Third Embodiment]

In the second embodiment, the extremely low magnification image creation function which sequentially completes the frame normalization integration computation for each divided region (that is, a method of completing the frame normalization integration computation for each region from region 1 to region 16) is described. In the present embodiment, an extremely low magnification image creation function that processes all the divided regions in parallel by sequentially processing the frame normalization integration computation in each divided region integration computation by integration computation will be described.

As described above, the frame integration number to be set is greatly influenced by composition elements and structures of the sample and observation conditions (accelerating voltage, irradiation yield, degree of vacuum, working distance (WD), and the like). Here, it is generally known that these observation conditions are influenced by disturbance in a peripheral environment of apparatus such as temperature, vibration, electric field, and magnetic field and a slight change occurs in the optical characteristics. That is, there is concern that the frame integration number may also be influenced by the disturbance of the peripheral environment of apparatus.

That is, in the extremely low magnification image creation function described in the second embodiment, in a short period of time within a period of time from the start of the integrated image acquisition of the region 1 to the completion of the integrated image acquisition of the final region 16, in a case where "vibration", for example, greatly fluctuates in the peripheral environment of apparatus, in the method of the second embodiment, the region just under the integration computation at the time of the fluctuation is greatly influenced by the "vibration". As a result, there is concern that only in that region, image quality is bad, noise is added, and the integration number is extremely increased. Accordingly, as a method to smooth this influence as much as possible, an example of an extremely low magnification image creation function of the present embodiment is proposed.

Also, attention is paid to charge of the sample. In the frame-integrated image acquisition of the second embodiment, a plurality of frame images are acquired in each divided region in order to acquire a frame-integrated image in each divided region. Here, in order to acquire the first frame image, a frame scan is performed to acquire a frame image. Thereafter, in order to acquire the second frame image, second frame scan is performed to acquire a second frame-integrated image. As such, the process described above is repeated until an image index (evaluation reference value) defined by the user is satisfied. This means that the frame scan is continuously executed on the same sample region until a frame-integrated image satisfying the image index can be constructed. Here, in the case of a sample that is easy to charge, there is concern that the sample will be charged by continuous beam irradiation and luminance value saturation and drift due to the change will occur. The extremely low magnification image creation function of the third embodiment also exhibits an effective effect against this problem.

Figure 33:
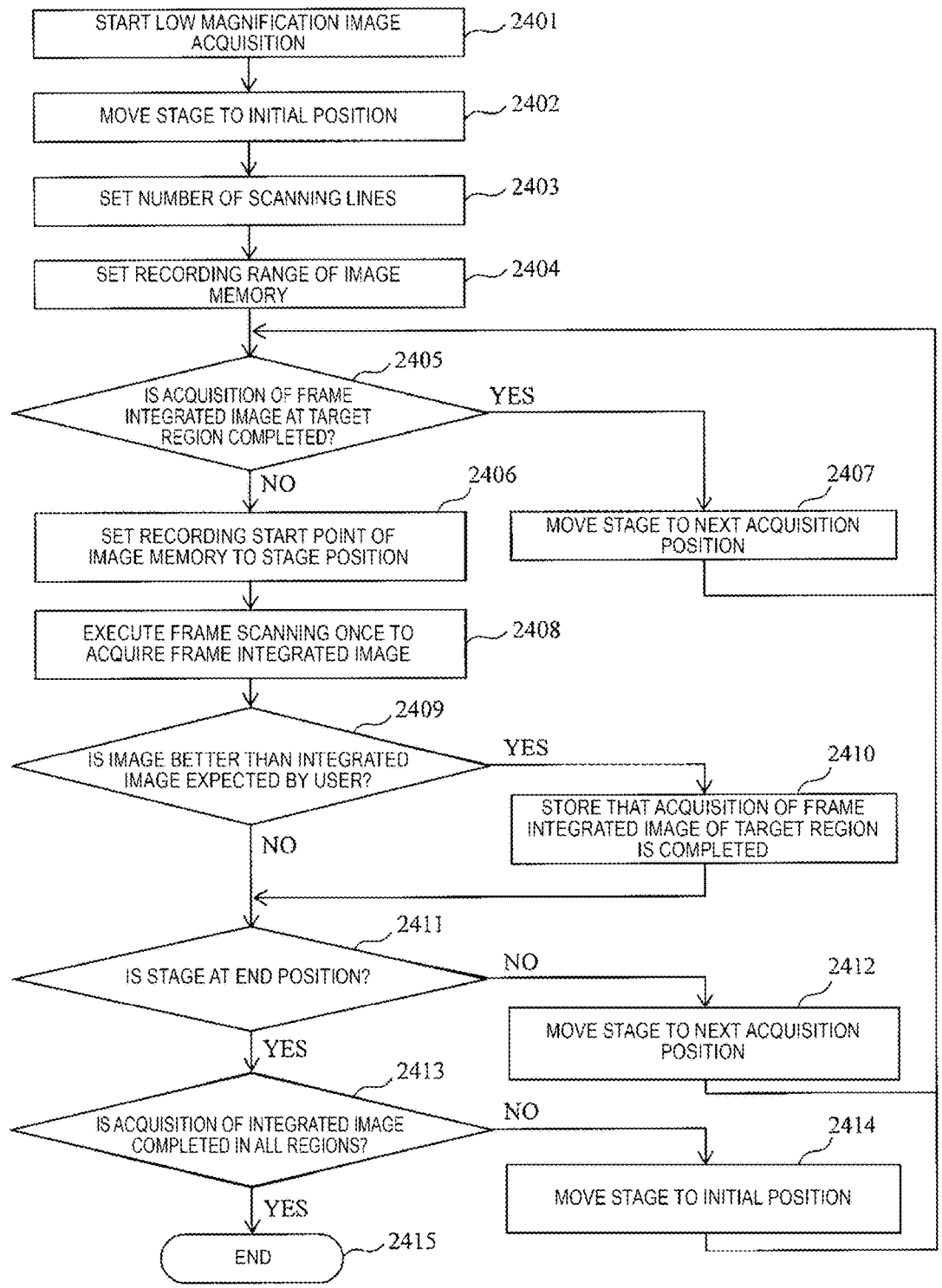
FIG. 33 is a flowchart for explaining a processing flow of extremely low magnification image acquisition (integrated image parallel-acquisition type) in which the frame-integrated image acquisition function of the present invention is implemented.

FIG. 33 illustrates a processing flow of creation of an extremely low magnification image according to the present embodiment, and FIGS. 34 to 39 illustrate an outline of scanning for creating an extremely low magnification image. FIG. 40 illustrates a GUI for acquiring an extremely low magnification image.

The image processing unit 513 updates the integrated image on the display unit of the information transmission apparatus 521 according to the number of times of execution of integration processing (normalization integration computation) for each of the plurality of divided regions. The image processing unit 513 determines the end of integration processing according to the image quality of the integrated image for each of the plurality of divided regions.

More specifically, the image processing unit 513 executes the normalization integration computation once for each of the plurality of divided regions. The image processing unit 513 executes the normalization integration computation only for the divided regions that do not satisfy the evaluation condition on the next time and thereafter. In the following, the first, second, (M−1)-th, and M-th normalization integration computation the will be described.

A screen 2601 is displayed on the display device of the information transmission apparatus 521. The user decides the observation region for which the frame-integrated image is intended to be acquired, performs various settings, and then executes the low magnification image acquisition (STEP 2401). When the execution instruction is received, the information processing unit 517 moves the sample stage (stage) 508 to the initial coordinates via the stage control unit 518 based on coordinate data which is set on the screen 2601 (STEP 2402).

Next, the information processing unit 517 sets the number of scanning lines in the deflection control unit 519 (STEP 2403). Next, the information processing unit 517 sets the recording range of the frame memory 514 (STEP 2404).

<Acquisition of First Integrated Image>

Figure 34:
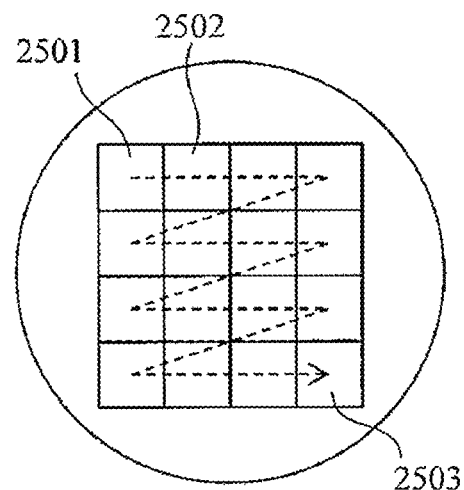
FIG. 34 is a diagram for explaining an outline of scanning of extremely low magnification image acquisition (integrated image parallel-acquisition type) of the present invention.

A case of acquiring the first integrated image will be described with reference to FIGS. 34 and 35. The information processing unit 517 determines whether acquisition of the frame-integrated image is completed in a target divided region (STEP 2405). Since it is now immediately after the start of extremely low magnification image acquisition and the image of the first frame of region 1 (2501) is not acquired, the information processing unit 517 sets a recording start point of the frame memory 514 in a region corresponding to the region 1 (2501) coordinates (STEP 2406).

Next, the frame scan is executed once and the image processing unit 513 acquires image data. The image processing unit 513 executes the frame normalization integration computation (FIGS. 7 and 8) described in the first embodiment. Here, because it is the image of the first frame, the image processing unit 513 outputs the acquired image as it is to the frame memory 514, the information processing unit 517, and the image evaluation unit 522. Image data 2511 is stored in the frame memory 514 as integrated image data of the first frame (integrated image data to which integration is applied once). The image evaluation unit 522 evaluates the input image data 2511 (STEP 2409). Here, it is assumed that the image data 2511 of the region 1 (2501) is an image that does not having image quality expected by the user. The information processing unit 517 determines that acquisition of the frame-integrated image of the region 1 (2501) is incomplete.

The image data 2511 output to the information processing unit 517 is transferred to the information transmission apparatus 521. In an image display window 2602, the image data 2511 is displayed as an integrated image being integrated. Next, the information processing unit 517 determines whether the stage position is the final position, that is, the region 16 (2503) or not (STEP 2411). Since the image of the region 1 (2501) is now acquired, the information processing unit 517 moves the stage to the next region 2 2502) via the stage control unit 518 (STEP 2412). Thereafter, STEP 2405 to STEP 2412 described above are repeated to acquire image data 2512 of the region 2 (2502) to image data 2513 of the region 16 (2503).

Figure 35:
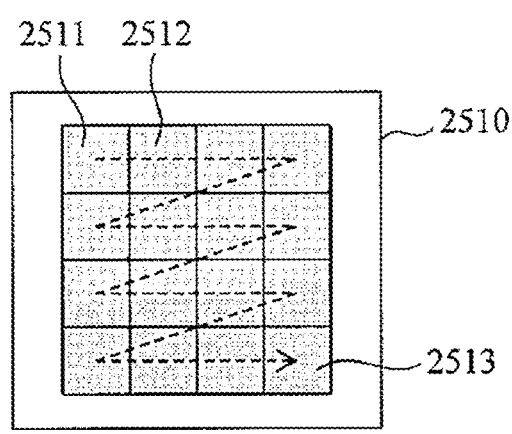
FIG. 35 is a diagram for explaining the outline of scanning of extremely low magnification image acquisition (integrated image parallel-acquisition type) of the present invention.

Here, as illustrated in FIG. 35, it is assumed that integrated image data acquired in the first the frame scan is not the image having image quality expected by the user in any region of 16 regions of an extremely low magnification image 2510. After image data 2513 of the region 16 (2503) is acquired, the information processing unit 517 determines whether acquisition of the integrated image is completed in all regions (STEP 2413). In this case, since an image that does not having image quality expected by the user is obtained in any region, the information processing unit 517 moves the stage to the initial position 2501 via the stage control unit 518 (STEP 2414).

<Acquisition of Second Integrated Image>

Next, a case of acquiring a second integrated image will be described with reference to FIG. 36. STEP 2405 to STEP 2412 described above are repeated. The information processing unit 517 determines whether acquisition of the frame-integrated image is completed in a divided region which becomes a target (STEP 2405). Here, since the acquisition of the frame-integrated image of the region 1 (2501) is not completed, the information processing unit 517 sets the recording start point of the frame memory 514 in the region corresponding to the region 1 (2501) coordinates (STEP 2406).

Next, the frame scan is executed once and the image processing unit 513 acquires image data. The image processing unit 513 executes the frame normalization integration computation (FIGS. 7 and 8) described in the first embodiment. The image processing unit 513 executes the frame normalization integration computation of image data detected by the current the frame scan and image data which is stored in the frame memory 514 and corresponds to the region 1 (2501).

The image processing unit 513 outputs image data (frame-integrated image) 2521 to the frame memory 514, the information processing unit 517, and the image evaluation unit 522. The image data 2521 is stored in the frame memory 514 as integrated image data of the second frame (integrated image data to which integration is applied twice). The image evaluation unit 522 evaluates the input image data 2521 (STEP 2409). Here, it is assumed that the image data 2521 of the region 1 (2501) is an image that does not have image quality expected by the user. The information processing unit 517 determines that acquisition of the frame-integrated image of the region 1 (2501) is incomplete.

The image data 2521 output to the information processing unit 517 is transferred to the information transmission apparatus 521. In the image display window 2602, the image data 2521 is displayed as an integrated image being integrated. Next, the information processing unit 517 determines whether the stage position is the final position, that is, the region 16 or not (2503) (STEP 2411). Since the image of the region 1 (2501) is now acquired, the information processing unit 517 moves to the next region 2 (2502) via the stage control unit 518 (STEP 2412). Thereafter, STEP 2405 to STEP 2412 described above are repeated to acquire image data 2522 of the region 2 (2502) to image data 2523 of region 16 (2503).

Figure 36:
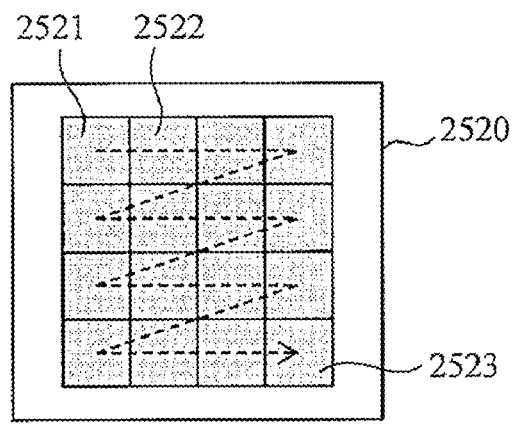
FIG. 36 is a diagram for explaining the outline of scanning of extremely low magnification image acquisition (integrated image parallel-acquisition type) of the present invention.

Here, as illustrated in FIG. 36, it is assumed that the second frame-integrated image data is an image that does not have image quality expected by the user in any region of 16 regions of an extremely low magnification image 2520. After image data 2523 of the region 16 (2503) is acquired, the information processing unit 517 determines whether acquisition of the integrated image is completed in all regions (STEP 2413). Here, since an image that does not have image quality expected by the user is obtained in any region, the information processing unit 517 moves the stage to the initial position 2501 via the stage control unit 518 (STEP 2414).

<Acquisition of (M−1)-th Integrated Image>

Thereafter, a case where STEP 2405 to STEP 2414 are repeated a plurality of times to acquire an (M−1)-th integrated image will be described with reference to FIG. 37. The information processing unit 517 determines whether acquisition of the frame-integrated image is completed in the divided region which becomes a target (STEP 2405). Here, since the acquisition of the frame-integrated image of the region 1 (2501) is not completed, the information processing unit 517 sets the recording start point of the frame memory 514 in the region corresponding to the region 1 (2501) coordinates (STEP 2406).

Next, the frame scan is executed once, and the image processing unit 513 acquires image data. The image processing unit 513 executes the frame normalization integration computation (FIGS. 7 and 8) described in the first embodiment. The image processing unit 513 executes the frame normalization integration computation of image data detected by the current the frame scan and image data stored in the frame memory 514 corresponding to the region (2501).

The image processing unit 513 outputs image data (frame-integrated image) 2531 to the frame memory 514, the information processing unit 517, and the image evaluation unit 522. The image data 2531 is stored in the frame memory 514 as integrated image data of the (M−1)-th frame (integrated image data to which integration is applied (M−1) times). The image evaluation unit 522 evaluates the input image data 2531 (STEP 2409). Here, it is assumed that the image data 2531 of the region 1 (2501) is an image having image quality expected by the user. The information processing unit 517 determines that acquisition of the integrated image in the region 1 (2501) is completed. The information processing unit 517 stores in a storing unit of the information processing unit 517 that acquisition of the frame-integrated image of the region 1 (2501) is completed (STEP 2410).

The image data 2531 output to the information processing unit 517 is transferred to the information transmission apparatus 521. In the image display window 2602, the image data 2531 is displayed as an integrated image being integrated. Next, the information processing unit 517 determines whether the stage position is the final position, that is, the region 16 (2503) or not (STEP 2411). Since the image of the region 1 (2501) is now acquired, the information processing unit 517 moves the stage to the next region 2 (2502) via the stage control unit 518 (STEP 2412). Thereafter, STEP 2405 to STEP 2412 described above are repeated to acquire image data 2532 of the region 2 (2502) to image data 2533 of the region 16 (2503).

Figure 37:
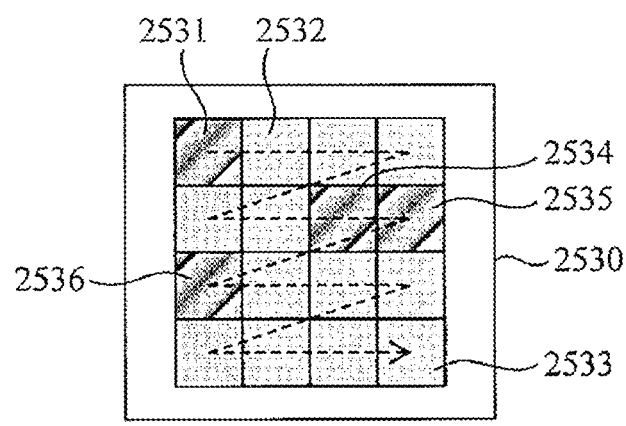
FIG. 37 is a diagram for explaining the outline of scanning of extremely low magnification image acquisition (integrated image parallel-acquisition type) of the present invention.

Here, as illustrated in FIG. 37, it is assumed that if the image data 2531 of the region 1, image data 2534 of the region 7, image data 2535 of the region 8, and image data 2536 of the region 9 are images having image quality expected by the user. After the image data 2533 of the region 16 (2503) is acquired, the information processing unit 517 determines whether acquisition of the integrated image is completed in all regions of the extremely low magnification image 2530 (STEP 2413). Here, since the image having image quality expected by the user is still not obtained in all regions of the extremely low magnification image 2530, the information processing unit 517 moves the stage to the initial position 2501 via the stage control unit 518 (STEP 2414).

<Acquisition of M-th Integrated Image>

Figure 38:
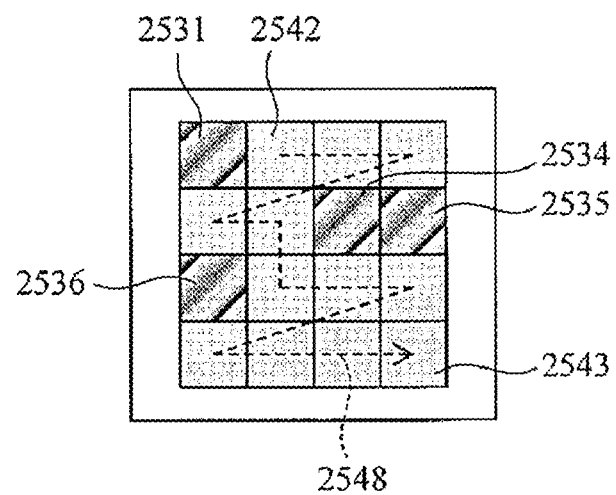
FIG. 38 is a diagram for explaining the outline of scanning of extremely low magnification image acquisition (integrated image parallel-acquisition type) of the present invention.

Next, a case of acquiring an M-th integrated image will be described with reference to FIG. 38. STEP 2405 to STEP 2412 described above are repeated. The information processing unit 517 determines whether acquisition of the frame-integrated image is completed in the divided region which becomes the target (STEP 2405). Here, since acquisition of the frame-integrated image of the region 1 (2501) is completed, the information processing unit 517 moves the stage to the next region 2 (2502) via the stage control unit 518 (STEP 2407). As described above, the region where acquisition of the frame-integrated image is completed is skipped, and a frame-integrated image is acquired only for the region for which acquisition of the frame-integrated image is not completed.

Next, the information processing unit 517 determines whether acquisition of the frame-integrated image is completed in the region 2 or not (2502) (STEP 2405). Here, since acquisition of the frame-integrated image of the region 2 (2502) is not completed, the information processing unit 517 sets the recording start point of the frame memory 514 in the region corresponding to the region (2502) coordinates (STEP 2406).

Next, the frame scan is executed once, and the image processing unit 513 acquires image data. The image processing unit 513 executes the frame normalization integration computation (FIGS. 7 and 8) described in the first embodiment. The image processing unit 513 executes the frame normalization integration computation of image data detected by the current frame scan and image data stored in the frame memory 514 corresponding to the region (2502).

The image processing unit 513 outputs image data (frame-integrated image) 2542 to the frame memory 514, the information processing unit 517, and the image evaluation unit 522. The image data 2542 is stored in the frame memory 514 as integrated image data of the M-th frame (integrated image data to which integration is applied M times). The image evaluation unit 522 evaluates the input image data 2542 (STEP 2409). Here, it is assumed that the image data 2542 of the region 2 (2502) is an image that does not have image quality expected by the user. The information processing unit 517 determines that acquisition of the frame-integrated image of the region 2 (2502) is incomplete.

The image data 2542 output to the information processing unit 517 is transferred to the information transmission apparatus 521. On the image display window 2602, the image data 2542 is displayed as an integrated image being integrated. Next, the information processing unit 517 determines whether the stage position is the final position, that is, the region 16 (2503) or not (STEP 2411). Since the image of the region 2 (2502) is now acquired, the information processing unit 517 moves the stage to the next region 3 via the stage control unit 518 (STEP 2412). Thereafter, STEP 2405 to STEP 2412 described above are repeated until image data 2543 of the region 16 (2503) is acquired. However, as described above, acquisition of the image data 2534 of the region 7, the image data 2535 of the region 8, and the image data 2536 of the region 9 is been completed. Accordingly, the regions 7, 8 and 9 are skipped, and image data of the regions 3 to 6 and 10 to 16 which do not satisfy the evaluation condition are acquired (dotted arrow 2548).

Figure 39:
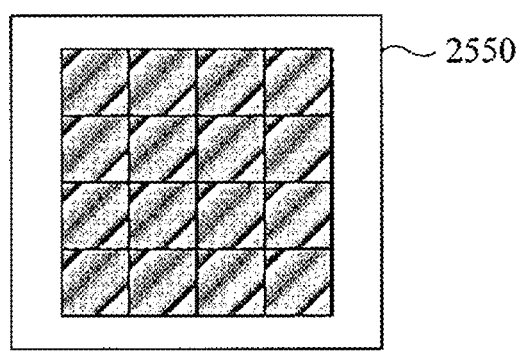
FIG. 39 is a diagram for explaining the outline of scanning of extremely low magnification image acquisition (integrated image parallel-acquisition type) of the present invention.
Figure 40:
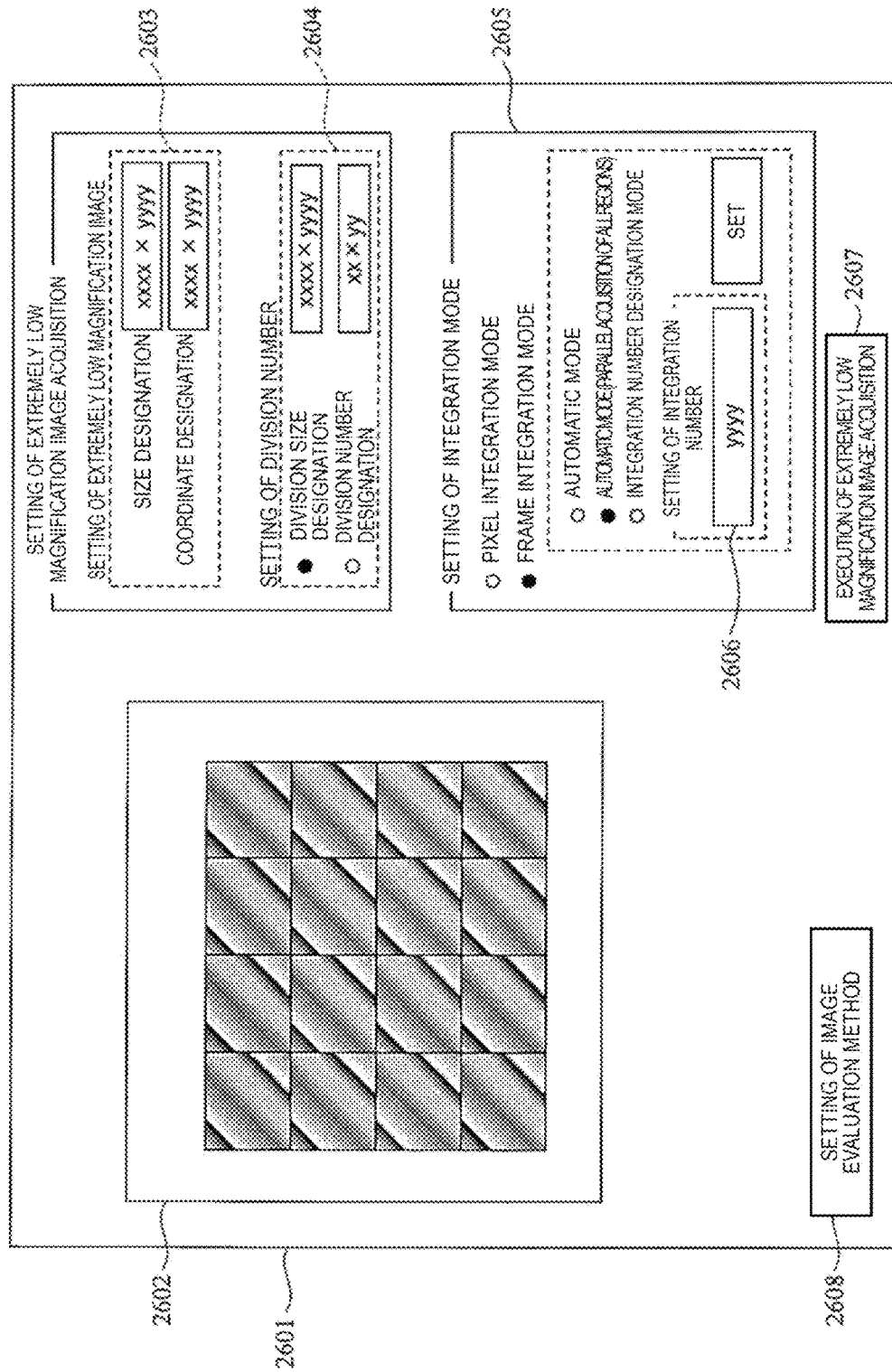
FIG. 40 is a GUI when the extremely low magnification image (integrated image parallel-acquisition type) of the present invention is acquired.

FIG. 39 illustrates an extremely low magnification image 2550 for which acquisition of the frame-integrated image is completed in all the divided regions. In the present embodiment, it is possible to construct an extremely low magnification image 2550 which becomes to have image quality expected by the user in all the regions.

In the example described above, the movement between the divided regions is executed by the stage, but is not limited thereto. An irradiation position of the electron beam may be moved by the deflection coil 505 as long as it is within a range changeable by deflection by the deflection coil 505. Also, the movement between the divided regions may be performed using both the stage and the deflector.

The operation flow when acquiring an extremely low magnification image is the same as that in FIG. 32 and thus, description thereof will be omitted. FIG. 40 illustrates a GUI when acquiring an extremely low magnification image. A screen 2601 includes an image display window 2602, an extremely low magnification image setting portion 2603, a division number setting portion 2604, an integration mode setting portion 2605, an image acquisition execution button 2607, and an evaluation method setting button 2608. The constituent elements 2602 to 2608 of the screen 2601 are the same as the constituent elements 2202 to 2208 of the screen 2201 of FIG. 31 and thus, description thereof will be omitted.

On the screen 2601, the number of times of execution (that is, the integration number) of the frame normalization integration computation of each divided region, the evaluation value of each divided region, and the like may be displayed.

As in the operation flow illustrated in FIG. 32, the user can acquire an extremely low magnification image only by operation of "image acquisition execution" without being never conscious of setting of the integration number. With this, it is possible to greatly improve time and effort for acquiring the extremely low magnification image. It is possible to greatly reduce the time required for image acquisition.

The present embodiment has the following effects.

(a) In contrast to the conventional plural image acquisition operations, in the present embodiment, a frame-integrated image is obtained by one image acquisition operation.

(b) In the present embodiment, it is possible to perform the integration scan with the minimum required number of integration by one image acquisition operation.

(c) By both effects described above, it is possible to reduce the irradiation time of the electron beam with which the sample is irradiated as much as possible.

(d) By suppressing the amount of electron beam with which the sample is irradiated to be minimized, it is possible to obtain secondary effects that suppresses sample destruction, contamination generation, generation of luminance value saturation and drift due to the influence of charging to be minimized.

In a case of being applied to the extremely low magnification image acquisition function, the above problem increases by M times according to the number M of division regions.

The present embodiment corresponds to the extremely low magnification image creation function of sequentially processing integration computations in each divided region one integration computation by one integration computation so as to process all regions in parallel. As described above, the frame integration number is influenced by the disturbance in the peripheral environment of apparatus. In a short period of time within a period of time from the start of the integrated image acquisition to the completion of the integrated image acquisition, in a case where "vibration", for example, greatly fluctuates in the peripheral environment of apparatus, the region just under the integration computation at the time of the fluctuation is greatly influenced by the "vibration", in the method of the second embodiment. As a result, there is concern that only in that region, image quality is bad, noise is added, and the integration number is extremely increased.

In the acquisition method of the present embodiment, a possibility that the influence can be dispersed as much as possible to a plurality of regions can be expected, and as a result, it is possible to smooth fluctuation of disturbance in the plurality of regions. Not only fluctuations in a short period of time but also, for example, even when the surrounding "temperature" of the apparatus fluctuates slowly over a long period of time, the influence of fluctuation can be smoothed in the plurality of regions by the same mechanism as described above.

As described above, the present embodiment has an advantage that it is possible to acquire a stable integrated image with little difference in the influence of fluctuation between the regions by smoothing the influence of fluctuation of the disturbance around the apparatus in comparison with the second embodiment. When attention is paid to charge of the sample, in the frame-integrated image acquisition of the second embodiment, the frame scan is continuously executed for the same region until the frame integration image satisfying the image index can be constructed in each of the divided regions. In the case of a sample which is easy to charge, there is a possibility of charging due to this continuous beam irradiation and generating saturation of luminance value and drift due to charging. In the present embodiment, since integration computation is performed one integration computation by one integration computation for each of the divided regions, it is intermittent beam irradiation from the viewpoint of each region. That is, charge generation can be suppressed, and an effect of charge reduction can also be obtained.

In the automatic mode, in order to avoid that the evaluation value does not reach the evaluation reference value even if integration processing is repeated and the frame-integrated image cannot be acquired forever, an upper limit value of the integration number may be set in the information processing unit 517. In a case where the upper limit value of the integration number reaches the upper limit value (in a case where a count value of the integration counter 601 reaches the upper limit value), the information processing unit 517 may forcibly end acquisition of the integrated image. For ease of use, it is also possible to consider a case the user may want to acquire an integrated image with as little noise as possible by setting the integration number to large. In this case, the upper limit of the number of integration may be set to large.

In the present embodiment, an example in which each divided region is scanned by moving a scan table is described, but is not limited to this example, and coordinate control of the region may be performed by another method, for example, using a coil or a lens.

In the present embodiment, an example in which the integrated image is displayed on the image display window 2602 at any time during the integration is described. By displaying the integrated image being integrated at any time in the image display window, the user can confirm the process in which an image of the entire region is gradually constructed (process of being integrated) in real time. There is an advantage that it is possible to visually ascertain the process of the integration situation and the degree of integration. In the present embodiment, an example in which the integrated image is displayed on the image display window 2602 at any time during the integration is described, but is not limited thereto. The integrated images of all the regions may be displayed in the image display window 2602 all together after completion of construction.

The present invention is not limited to the embodiments described above, but includes various modification examples. The embodiments described above have been described in detail in order to explain the present invention in an easy-to-understand manner, and are not necessarily limited to those having all the configurations described. A portion of the configuration of a certain example can be replaced by the configuration of another example. The configuration of another example can be added to the configuration of a certain example. It is possible to add, delete, and replace other configurations for a portion of the configuration of each example.

Each of the configurations, functions, processing units, processing means, and the like described above may be realized in hardware by designing a portion or all of them with, for example, an integrated circuit. Each of configurations, functions, and the like described above may be realized by software by allowing a processor to interpret and execute a program which realizes each function. Information such as programs, tables, files, and the like that realize each function can be stored in various types of non-transitory computer readable medium. As the non-transitory computer readable medium, for example, a flexible disk, a CD-ROM, a DVD-ROM, a hard disk, an optical disk, a magneto-optical disk, a CD-R, a magnetic tape, a nonvolatile memory card, a ROM, and the like are used.

In the embodiments described above control lines and information lines indicate what is considered to be necessary for explanation, and do not necessarily indicate all control lines and information lines for products. All the configurations may be connected to each other.

REFERENCE SIGNS LIST

501: vacuum column
502: electron gun (charged particle beam source)
503: electron beam (charged particle beam)
504: focusing lens
505: deflection coil
506: objective lens
507: sample
508: sample stage
510: detector
511: amplifier
512: ADC
513: image processing unit
514: frame memory
515: multiplier
516: adder
517: information processing unit
518: stage control unit
519: deflection control unit
520: information input device
521: information transmission apparatus
522: image evaluation unit
523: multiplier
524: deflection signal
525: control signal
526: image evaluation result
527: image data

The invention claimed is:

1. A charged particle beam device comprising:
a charged particle beam source;
a charged particle beam optical system that irradiates a sample with a charged particle beam from the charged particle beam source;
a detector that detects a secondary signal generated from the sample by irradiation with the charged particle beam;
an image processing unit that executes integration processing of image data obtained from the secondary signal and outputting an integrated image; and
a display unit that displays the integrated image output during integration,
wherein the image processing unit executes normalization integration computation of a luminance value of the integrated image at plural steps of the integration, and
wherein the image processing unit changes a coefficient of the integration based on a frame count value of the integration.

2. The charged particle beam device according to claim 1, wherein the image processing unit includes
a storing unit that stores the integrated image,
a first multiplier that outputs first image data obtained by multiplying the image data obtained from the secondary signal by a first coefficient,
a second multiplier that outputs second image data obtained by multiplying one previous integrated image by a second coefficient, and
an adder that adds the first image data and the second image data and outputs the integrated image,
wherein the first coefficient and the second coefficient vary according to the number of times of execution of the normalization integration computation and a sum of the first coefficient and the second coefficient is "1".

3. The charged particle beam device according to claim 1, further comprising:
an image evaluation unit that determines whether the integrated image obtained by the normalization integration computation satisfies a certain evaluation condition,
wherein the image processing unit repeatedly executes the normalized integration computation until the evaluation condition is satisfied.

4. The charged particle beam device according to claim 3, wherein the evaluation condition includes at least one of a condition with an SN ratio as an evaluation index, a condition with a degree of SN improvement as an evaluation index, a condition with a CNR as an evaluation index, and a condition with a luminance value histogram as an evaluation index.

5. The charged particle beam device according to claim 3, further comprising:
a display unit that displays the integrated image after the normalization integration computation and a setting unit for setting the evaluation condition.

6. The charged particle beam device according to claim 1, wherein the charged particle beam optical system irradiates each of a plurality of divided regions in the sample with the charged particle beam, and
the image processing unit outputs the integrated image obtained by the normalization integration computation to each of the plurality of divided regions.

7. The charged particle beam device according to claim 6, wherein the number of times of execution of the normalization integration computation is different between the plurality of divided regions.

8. The charged particle beam device according to claim 6, further comprising:
a display unit that displays the integrated images of all the divided regions in a joined form.

9. The charged particle beam device according to claim 6, further comprising:
an image evaluation unit that determines whether the integrated image obtained by the normalization integration computation satisfies a certain evaluation condition,
wherein the image processing unit repeatedly executes the normalization integration computation until the evaluation condition is satisfied for each of the plurality of divided regions.

10. The charged particle beam device according to claim 9,
wherein the image processing unit executes the normalization integration computation once for each of the plurality of divided regions, and executes the normalization integration computation, on the next time and thereafter, only on the divided region that does not satisfy the evaluation condition.

11. A charged particle beam device comprising:
a charged particle beam source;
a charged particle beam optical system that irradiates each of a plurality of divided regions in an area to be observed wider than the maximum size of the viewing field of the charged particle beam device with a charged particle beam from the charged particle beam source;
a detector that detects a secondary signal generated from each of the plurality of divided regions by irradiation with the charged particle beam;
an image processing unit that executes integration processing of image data obtained from the secondary signal and outputting an integrated image; and
a display unit that displays the integrated image output during integration for each of the plurality of divided regions,
wherein the image processing unit determines end of the integration processing according to image quality of the integrated image for each of the plurality of divided regions, and
wherein the image processing unit changes a coefficient of the integration based on a frame count value of the integration.

12. The charged particle beam device according to claim 11,
wherein the image processing unit updates the integrated image on the display unit for each of the plurality of divided regions and ends the integration processing at the time when the integrated image reaches expected image quality.

13. The charged particle beam device according to claim 11,
wherein the number of times of execution of the integration processing is different between the plurality of divided regions.

14. The charged particle beam device according to claim 11, further comprising:
an image evaluation unit that determines whether the integrated image of each of the plurality of divided regions satisfies a certain evaluation condition,
wherein the image processing unit repeatedly executes the integration processing until the evaluation condition is satisfied for each of the plurality of divided regions.

15. The charged particle beam device according to claim 14,
wherein the image processing unit executes the integration processing once for each of the plurality of divided regions, and executes the integration processing, on the next time and thereafter, only on the divided region that does not satisfy the evaluation condition.

16. The charged particle beam device according to claim 11,
wherein the integration processing is normalization integration computation of a luminance value of the integrated image in an integration process.

17. An image processing method in a charged particle beam device, the image processing method comprising:
a step of irradiating a sample with a charged particle beam from a charged particle beam source, by a charged particle beam optical system;
a step of detecting a secondary signal generated from the sample by irradiation with the charged particle beam, by a detector;
a step of executing integration processing of image data obtained from the secondary signal and outputting an integrated image, by an image processing unit; and
a step of displaying the integrated image output during integration,
wherein the executing step includes executing normalization integration computation of a luminance value of the integrated image at plural steps of the integration, and
wherein the executing step includes changing a coefficient of the integration based on a frame count value of the integration.

* * * * *